US012727177B2

(12) United States Patent
Chen et al.

(10) Patent No.: US 12,727,177 B2
(45) Date of Patent: Sep. 1, 2026

(54) PACKAGE WITH INTEGRATED VOLTAGE REGULATOR AND METHOD FORMING THE SAME

(71) Applicant: Taiwan Semiconductor Manufacturing Co., Ltd., Hsinchu (TW)

(72) Inventors: Wei-Yu Chen, Hsinchu (TW); Chung-Hui Chen, Hsinchu (TW); Hao-Cheng Hou, Hsinchu (TW); Jung Wei Cheng, Hsinchu (TW); Tsung-Ding Wang, Tainan (TW); Chien-Hsun Lee, Chu-tung (TW); Shang-Yun Hou, Jubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 523 days.

(21) Appl. No.: 18/158,078

(22) Filed: Jan. 23, 2023

(65) Prior Publication Data

US 2024/0055468 A1 Feb. 15, 2024

Related U.S. Application Data

(60) Provisional application No. 63/370,813, filed on Aug. 9, 2022.

(51) Int. Cl.
*H10D 1/20* (2025.01)
*H10W 70/09* (2026.01)
(Continued)

(52) U.S. Cl.
CPC .............. *H10D 1/20* (2025.01); *H10W 70/09* (2026.01); *H10W 90/00* (2026.01); *H10W 70/60* (2026.01); *H10W 90/10* (2026.01); *H10W 90/20* (2026.01)

(58) Field of Classification Search
CPC ........... H10D 1/20; H01L 24/19; H01L 24/24; H01L 25/0652; H01L 25/16; H01L 25/50;
(Continued)

(56) References Cited

U.S. PATENT DOCUMENTS

2015/0060127 A1* 3/2015 Terui ..................... H05K 1/141 29/831
2015/0228580 A1* 8/2015 Chen .................. H01L 23/5389 257/532

(Continued)

FOREIGN PATENT DOCUMENTS

CN 108074882 A 5/2018

*Primary Examiner* — Marlon T Fletcher
*Assistant Examiner* — Christina A Sylvia
(74) *Attorney, Agent, or Firm* — Slater Matsil LLP

(57) ABSTRACT

A method of forming an inductor including forming a first redistribution structure on a substrate, forming a first conductive via over and electrically connected to the first redistribution structure, depositing a first magnetic material over a top surface and sidewalls of the first conductive via, coupling a first die and a second die to the first redistribution structure, encapsulating the first die, the second die, and the first conductive via in an encapsulant, and planarizing the encapsulant and the first magnetic material to expose the top surface of the first conductive via while a remaining portion of the first magnetic material remains on sidewalls of the first conductive via, where the first conductive via and the remaining portion of the first magnetic material provide an inductor.

20 Claims, 22 Drawing Sheets

(51) Int. Cl.

| | |
|---|---|
| ***H10W 90/00*** | (2026.01) |
| *H10W 70/60* | (2026.01) |
| *H10W 90/10* | (2026.01) |
| *H10W 90/20* | (2026.01) |

(58) Field of Classification Search

CPC . H01L 2224/24137; H01L 2224/24141; H01L 2224/245; H01L 2924/1206; H01L 2924/1427; H01L 2924/19042; H01L 2924/30107; H01L 21/563; H01L 21/568; H01L 23/3128; H01L 23/645; H01L 2221/68327; H01L 2221/68345; H01L 2221/68359; H01L 2221/6835

See application file for complete search history.

(56) References Cited

U.S. PATENT DOCUMENTS

2018/0315706 A1 11/2018 Liao et al.
2020/0098621 A1 3/2020 Bharath et al.
2020/0176346 A1* 6/2020 Wu ..................... H01L 23/5385
2021/0111111 A1 4/2021 Dosluoglu
2021/0313269 A1 10/2021 Bhagavat et al.
2022/0375865 A1* 11/2022 Pietambaram ...... H01L 23/5384
2022/0375882 A1* 11/2022 Darmawikarta ......... H10D 1/20
2023/0411442 A1* 12/2023 Liao ........................ H01L 24/20

* cited by examiner 100
44-1
44-2
46-1
46-2
68
70
78A
78B
78BP
48
64
51
74
76A
76B
86
84
90
88
49
10
52
66
50
50

94

PACKAGE WITH INTEGRATED VOLTAGE REGULATOR AND METHOD FORMING THE SAME

PRIORITY CLAIM AND CROSS-REFERENCE

This application claims the benefit of U.S. Provisional Application No. 63/370,813, filed on Aug. 9, 2022, which application is hereby incorporated herein by reference.

BACKGROUND

Integrated circuit applications currently have increasingly more functions built therein, and are thus formed to be increasingly larger. Accordingly, many types of packages have been developed to suit to customized requirements of integrated circuits. Power networks are also built inside the packages to provide power to the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4A illustrate cross-sectional views of intermediate stages in the formation of a package including an inductor die in accordance with some embodiments.

FIGS. 4D-11A illustrate cross-sectional views of intermediate stages in the formation of a package including an inductor die in accordance with some embodiments.

DETAILED DESCRIPTION

Figure 1:
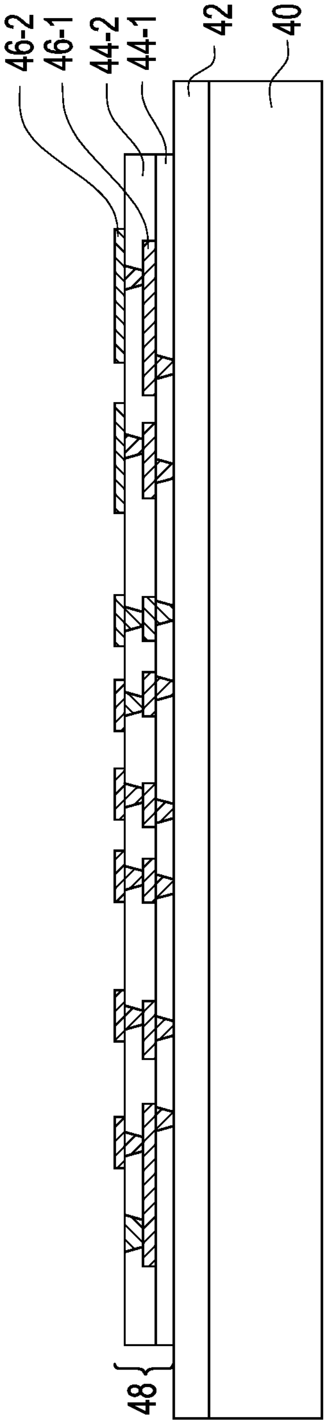

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “underlying,” “below,” “lower,” “overlying,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to forming an integrated circuit package that includes an integrated voltage regulator that comprises a conductive via having sidewalls coated with a magnetic material. The conductive via that is coated with the magnetic material and is electrically connected to a first integrated voltage regulator (IVR) die, and may be adjacent to or beneath the first IVR die. The integrated circuit package may comprise a package substrate. Outer sidewalls of a plating through-hole (PTH) of the package substrate may also be coated with the magnetic material, and the coated PTH is electrically connected to a second IVR die disposed above the PTH. Advantageous features of one or more embodiments disclosed herein may allow the coated conductive via and the coated PTH to act as inductors to enhance voltage regulation in the package. In addition, the conductive via disposed beneath the first IVR die allows for better voltage input control to the first IVR die.

Some embodiments may provide methods applied to forming the integrated circuit package that includes a conductive coil (also referred to as a redistribution line) in the package substrate and/or in integrated Fan-Out (inFO) redistribution layers (RDLs) of the integrated circuit package. Advantageous features of one or more of the alternate embodiments disclosed herein include allowing the conductive coil to be used as air core inductor to enhance voltage regulation in the package.

FIGS. 1 through 13 illustrate the intermediate stages in the formation of a package 100 including integrated voltage regulator (IVR) dies in accordance with some embodiments. FIG. 1 illustrates the formation of release film 42 on carrier 40. The carrier 40 may be a glass carrier, a silicon wafer, an organic carrier, or the like. The carrier 40 may have a round top-view shape in accordance with some embodiments. The release film 42 may be formed of a polymer-based material and/or an epoxy-based thermal-release material (such as a Light-To-Heat-Conversion (LTHC) material), which is capable of being decomposed under radiation such as a laser beam, so that the carrier 40 may be de-bonded from the overlying structures that will be formed in subsequent processes. In accordance with some embodiments, the release film 42 is applied on the carrier 40 through coating.

A redistribution structure 48, which includes a plurality of dielectric layers 44 and a plurality of Redistribution Lines (RDLs) 46, is formed over the release film 42. As shown in FIG. 1, a first dielectric layer 44-1 is formed on the release film 42. In accordance with some embodiments, the dielectric layer 44-1 is formed of or comprises an organic material, which may be a polymer. The organic material may also be a photo-sensitive material. For example, the dielectric layer 44-1 may be formed of or comprises polyimide, PBO, BCB, or the like. The dielectric layer 44-1 may be formed using a process such as lamination, coating, (e.g., spin-coating), chemical vapor deposition (CVD), or the like.

A first plurality of RDLs 46 (denoted as 46-1) are formed on dielectric layer 44-1. The formation of RDLs 46-1 may include patterning dielectric layer 44-1 to form via openings, forming a metal seed layer (not shown) over dielectric layer 44-1 and extending into the via openings, forming a patterned plating mask (not shown) such as a photoresist over the metal seed layer, and then performing a metal plating process to deposit a metallic material (e.g., copper, or the like) on the exposed metal seed layer. The patterned plating mask and the portions of the metal seed layer covered by the patterned plating mask are then removed, leaving RDLs 46-1 as shown in FIG. 1. In accordance with some embodiments, the metal seed layer includes a titanium layer and a copper layer over the titanium layer. The metal seed layer may be formed using, for example, PVD or a like process. The plating process may be performed using, for example, an electrochemical plating process or an electro-less plating process.

FIG. 1 further illustrates the formation of additional dielectric layer(s) 44-2 and additional RDLs (such as RDLs 46-2), for example. Throughout the description, dielectric layers 44-1 and 44-2 are individually and collectively referred to as dielectric layers 44, and RDLs 46-1 and 46-2 are individually and collectively referred to as RDLs 46. In accordance with some embodiments, dielectric layer 44-2 is first formed on RDLs 46-1. The bottom surface of dielectric layer 44-2 is in contact with the top surfaces of RDLs 46-1 and dielectric layer 44-1. Dielectric layer 44-2 may be formed of or comprise an organic dielectric material, which may be a polymer. For example, dielectric layer 44-2 may comprise a photo-sensitive material such as PBO, polyimide, BCB, or the like. Dielectric layer 44-2 is then patterned to form via openings (occupied by the via portions of RDLs 46-2) therein. Hence, some portions of RDLs 46-1 are exposed through the openings in dielectric layer 44-2.

Next, RDLs 46-2 are formed on dielectric layer 44-2 to connect to RDLs the 46-1. The RDLs 46-2 include via portions (also referred to as vias) extending into the openings in the dielectric layer 44-2, and trace portions (metal line portions, or RDL lines) over the dielectric layer 44-2. The formation of the RDLs 46-2 may be similar to the formation of the RDLs 46-1. Each of the vias may have a tapered profile, with the upper portions being wider than the corresponding lower portions.

After the formation of the RDLs 46-2, there may be more dielectric layers and the corresponding RDLs formed, with the upper RDLs over and landing on the respective lower RDLs. The materials of the more dielectric layers may be selected from the same group (or different group) of candidate materials as the dielectric layers 44-1 and 44-2, which candidate materials may include a polymer such as polyimide, PBO, BCB, or the like. The dielectric layers 44 and the RDLs 46 collectively form redistribution structure 48.

Figure 2:
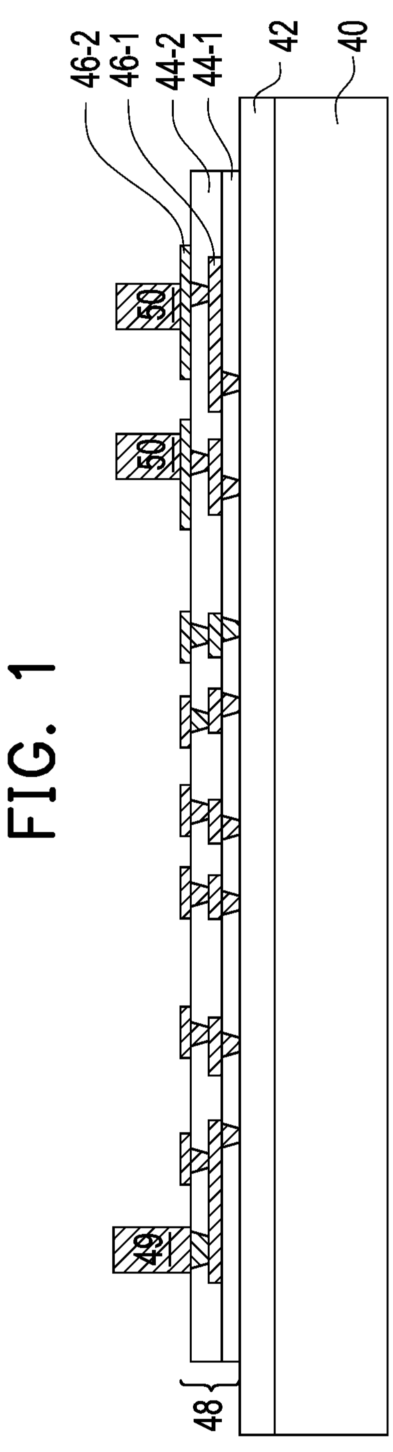

Referring to FIG. 2, after the formation of the interconnect structure 48, conductive vias (including conductive vias 49 and conductive vias 50) may be formed over the interconnect structure 48. The formation of the conductive vias 49 and the conductive vias 50 may include depositing a metal seed layer over RDLs 46, and forming a patterned plating mask, through which some portions of the metal seed layer are exposed. In accordance with some embodiments, the metal seed layer may include a copper layer, a titanium layer and a copper layer over the titanium layer, or the like. A plating process is then performed to plate a metallic material (e.g., copper, or the like) into the openings in the plating mask. The plating process may be performed using, for example, an electrochemical plating process or an electro-less plating process. The plating mask is then removed, followed by the etching of the exposed portions of the metal seed layer to form the conductive vias 49 and the conductive vias 50. The conductive vias 49 and the conductive vias 50 are formed to be electrically connected to the RDLs 46. The conductive vias 49 may have similar dimensions, be made of a same material, and have a similar shape as each of the conductive vias 50.

Figure 3:
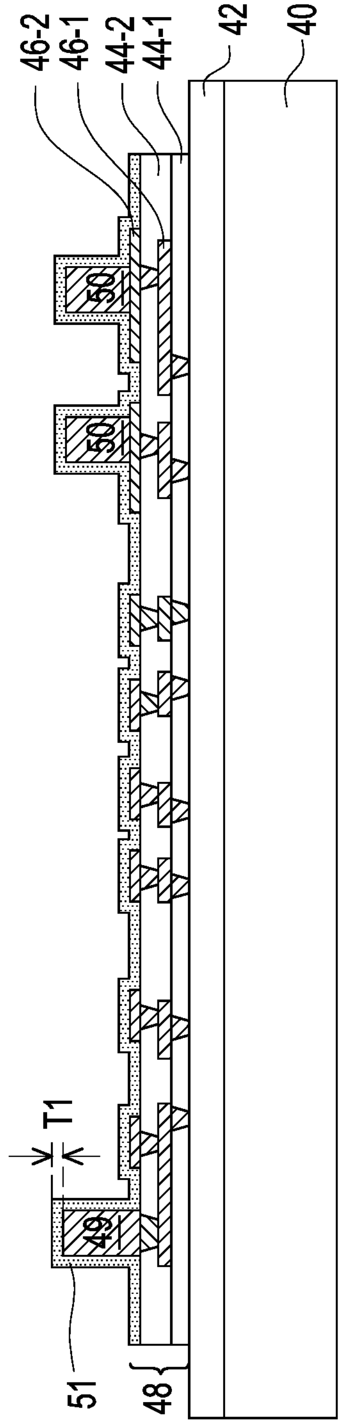

In FIG. 3, a magnetic material 51 is deposited over the structure shown in FIG. 2, such as over the conductive via 49, the conductive vias 50, the carrier 40, the dielectric layers 44, and the RDLs 46. These magnetic material 51 may comprise cobalt zirconium tantalum (CoZrTa), Ni—Fe—Co alloy, or the like. The magnetic material 51 may formed using a deposition process such as CVD, PVD, ALD, or the like. In an embodiment, a thickness T1 of the magnetic material 51 is in a range from 100 nm to 1,000,000 nm.

Figure 4A:
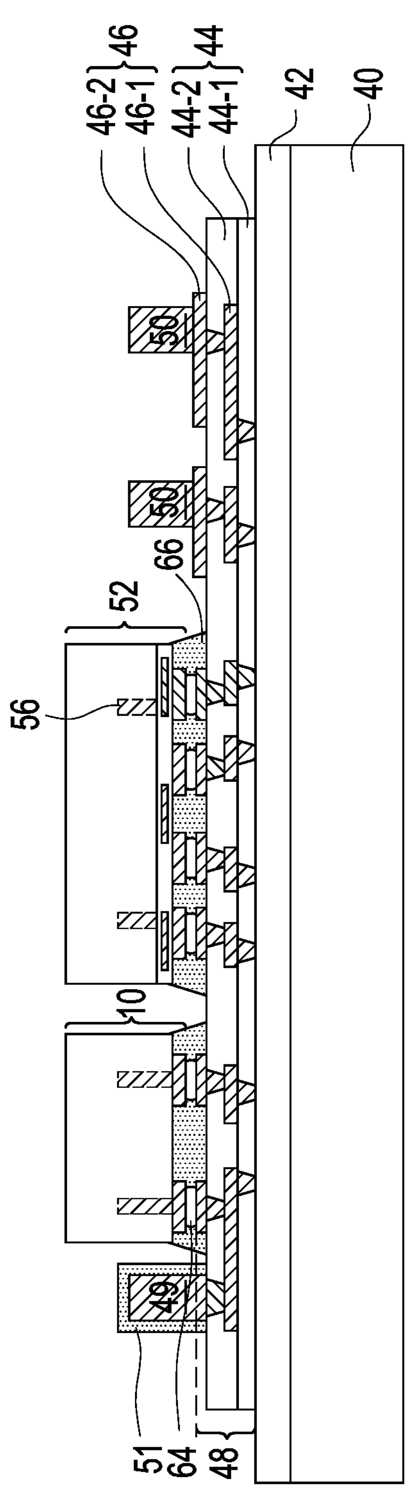

In FIG. 4A, a mask layer (not shown) is then formed over the magnetic material 51. The mask layer may be a photoresist, or the like, and may be formed using a spin coating or deposition process. The mask layer may be patterned using acceptable development and exposure techniques to expose a first portion of the magnetic material 51, but cover a second portion of the magnetic material 51 over sidewalls and a top surface of the conductive via 49. A suitable etching process is then performed using the mask layer as an etching mask to remove the exposed first portion of the magnetic material 51. For example, the magnetic material 51 over sidewalls and top surfaces of the conductive vias 50 and on top surfaces of the interconnect structure 48 may be removed. The etching process may be selective such that it etches the magnetic material 51 without significantly etching the conductive vias 50 or materials of the interconnect structure 48. The etching process may be a plasma dry etching process, or the like. After the etching process, the second portion of the magnetic material 51 remains over the sidewalls and the top surface of the conductive via 49, such that the magnetic material 51 surrounds and encircles an entirety of the sidewalls of the conductive via 49. The mask layer may be removed by an acceptable ashing or stripping process, such as using an oxygen plasma or the like.

FIG. 4A further illustrates the bonding of a plurality of dies to the RDLs 46. The bonded dies may include one or more integrated voltage regulator (IVR) dies 10 and discrete die 52. Discrete die 52 represents one or more of passive device dies, interconnect dies, and or the like that may be bonded in this process. For example, discrete die(s) 52 may include an Independent Passive Device (IPD) die including a capacitor therein, an IPD die including a resistor therein, an interconnect die for bridging two device dies, and/or the like.

Figure 4B:
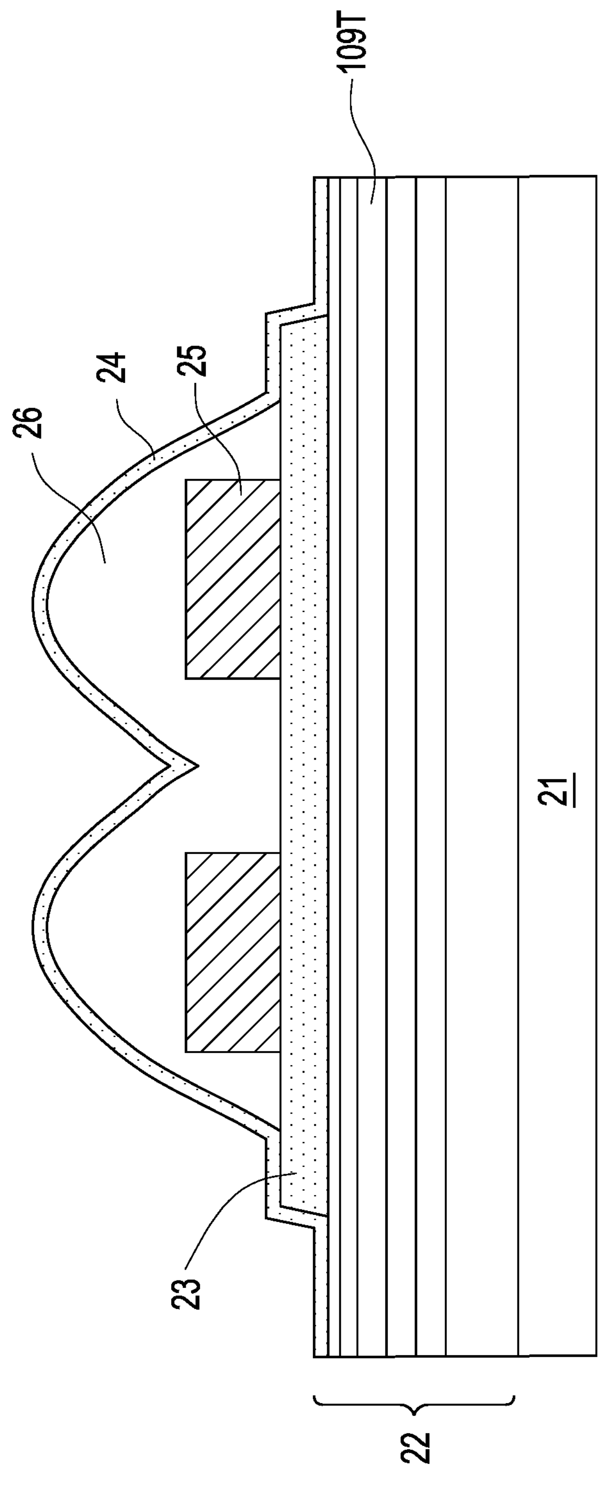
FIG. 4B illustrates a cross-sectional view of an inductor die in accordance with some embodiments.

FIG. 4B illustrates an example IVR die 10. In accordance with some embodiments of the present disclosure, the IVR die 10 include voltage regulators for regulating voltage supplies for the overlying dies. The IVR die 10 may include a semiconductor substrate 21, which may be a silicon substrate, silicon carbon substrate, III-V compound semiconductor substrate, or the like. The IVR die 10 may also include an interconnect structure 22 that includes a plurality of dielectric layers, and metal lines and vias in the dielectric layers. Dielectric layers may include Inter Metal Dielectric (IMD) layers, which may be formed of low-k dielectric materials having dielectric constants (k values) lower than about 3.5, lower than about 3.0, or lower than about 2.5, for example. In other embodiments, the dielectric layers may comprise non low-k passivation layers such as silicon nitride layers, silicon oxide layers, Un-doped Silicate Glass (USG) layers, and/or polymer layers.

In accordance with some embodiments, The IVR die 10 may comprise active devices such as transistors, or the like. In addition, the IVR die 10 may comprise passive devices such as capacitors, transformers, inductors, resistors, and the like. For example, the IVR die may comprise an inductive component that includes magnetic film 23 over the interconnect structure 22, and conductive features 25 (e.g., copper coils) over the magnetic film 23. The magnetic film 23 may comprise cobalt zirconium tantalum (CoZrTa), or the like. A polymer layer 26 surrounds each of the conductive features 25. The polymer layer may comprise a photosensitive polyimide material, such as PBO, or the like. In an embodiment, top surfaces of the polymer layer 26 are higher than top surfaces of the conductive features 25. A magnetic film 24 is disposed over the polymer layer 26 and the conductive features 25. The magnetic film 24 may comprise cobalt zirconium tantalum (CoZrTa), or the like. The IVR die 10 may or may not include through-vias (alternatively referred to as through-silicon vias or through-substrate vias) penetrating through the semiconductor substrate of the IVR die 10.

Figure 4C:
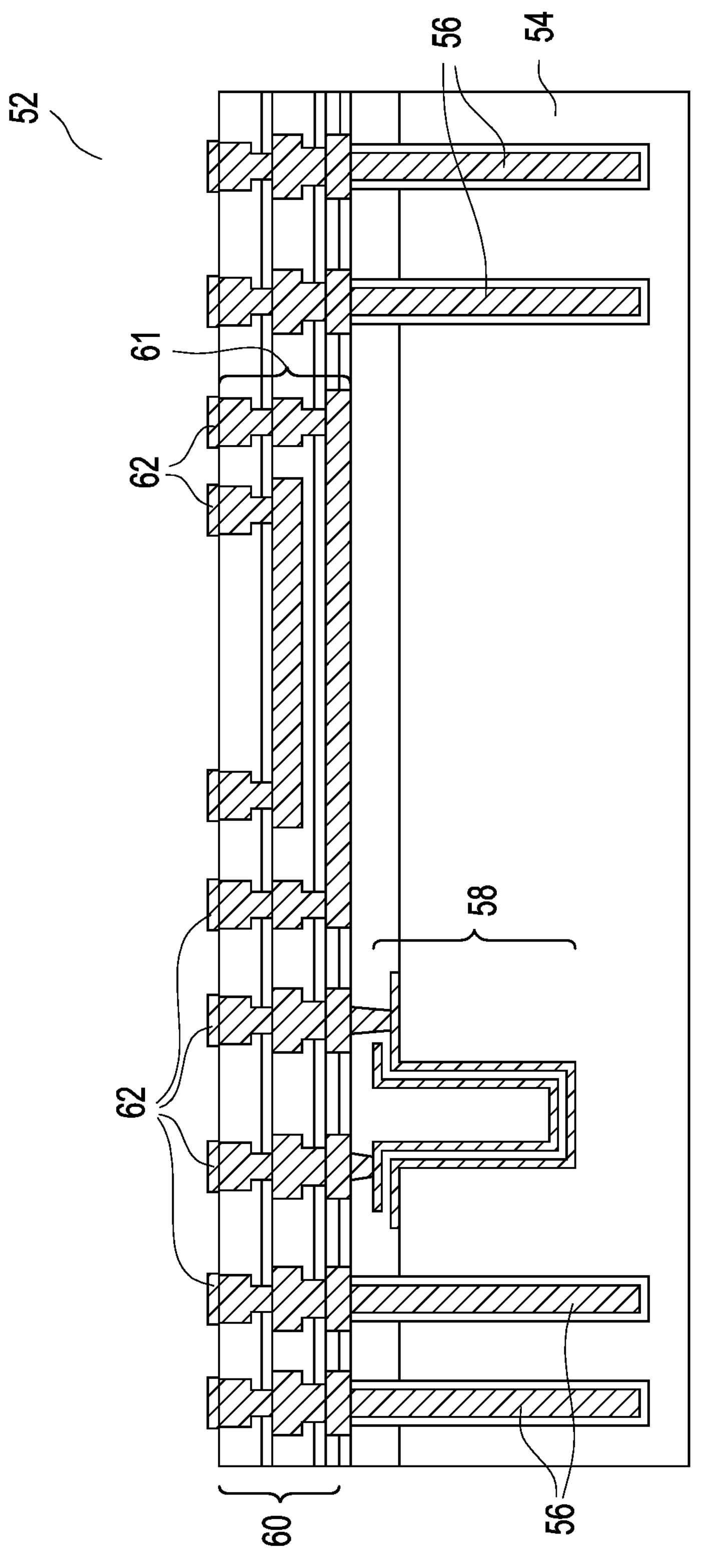
FIG. 4C illustrates a cross-sectional view of a discrete die in accordance with some embodiments.

FIG. 4C illustrates an example discrete die 52 in accordance with some embodiments. It is appreciated that discrete die 52 represents some of the possible structures of discrete dies, and may include one or more of features such as through-vias, interconnect paths, capacitors, and the like. Die 52 may include substrate 54, which may be a semiconductor substrate such as a silicon substrate. Substrate 54 may also be a dielectric substrate, which is formed of a dielectric material such as silicon oxide, silicon nitride, or the like. In accordance with some embodiments, there is no through-via formed to extend into, regardless of whether substrate 54 is formed of a semiconductor or a dielectric material. In accordance with alternative embodiments, through-vias 56 are formed to extend into substrate 54.

In accordance with some embodiments, discrete die 52 is free from active devices such as transistors and diodes therein. Discrete die 52 may or may not include passive devices such as capacitors, transformers, inductors, resistors, and the like. In accordance with alternative embodiments of the present disclosure, discrete die 52 include passive devices. For example, discrete die 52 may be an IPD die including capacitor 58 (which may be a deep-trench capacitor) formed in discrete die 52. Discrete die 52 may also be an IPD die including a resistor therein.

Discrete die 52 may act as a bridge die (sometimes referred to as a local silicon interconnect (LSI)), and may include interconnect structure 60 over substrate 54. Interconnect structure 60 further includes dielectric layers and metal lines and vias in the dielectric layers. The dielectric layers may include Inter-Metal Dielectric (IMD) layers. In accordance with some embodiments, some of the dielectric layers are formed of low-k dielectric materials having dielectric constant values (k-value) lower than 3.8, and the k-values may be lower than about 3.0 or about 2.5. The low-k dielectric layers may be formed of a carbon-containing low-k dielectric material, Hydrogen SilsesQuioxane (HSQ), MethylSilsesQuioxane (MSQ), or the like. The formation of the metal lines and vias may include single damascene and dual damascene processes. Bond structures 62 such as metal pillars or metal pads are formed at the surface of discrete die 52. Discrete die 52 may include bridges 61, which include metal lines and vias. Each of the bridges 61 is connected to two bond structures, so that the bridges 61 may be used to electrically interconnect two or more package components (such as device dies) in subsequent processes.

Referring back to FIG. 4A, in accordance with some embodiments, the bonding of IVR die 10 and discrete die 52 to RDLs 46 may be performed through solder bonding or metal-to-metal direct bonding. For example, the bonding may be performed through solder regions 64. After the bonding, underfill 66 is dispensed into the gaps between discrete die 52, IVR die 10, and their corresponding underlying RDLs 46, and is then cured. In accordance with some embodiments, underfill 66 may include a base material, which may include a polymer, a resin, an epoxy, and/or the like, and filler particles in the base material. The filler particles may be dielectric particles of silica, alumina, boron nitride, or the like, and may have spherical shapes.

Figure 4D:
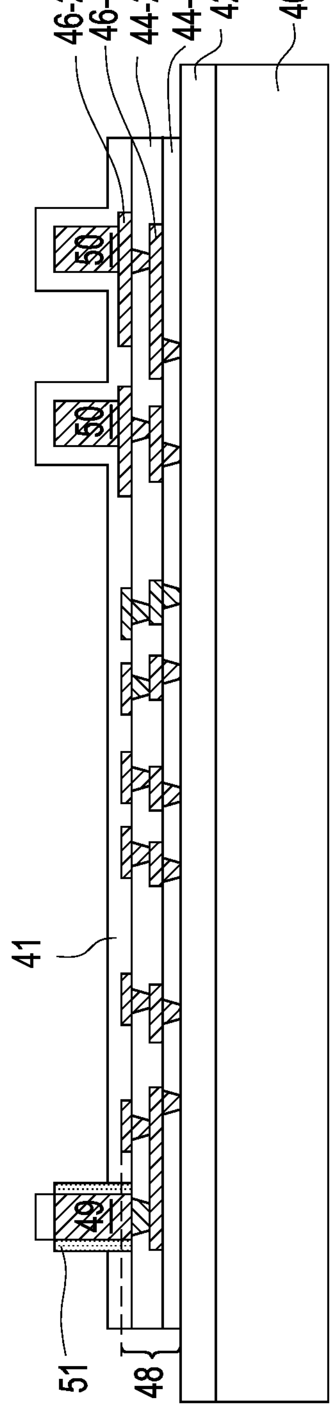
Figure 4D:
Figure 4E:
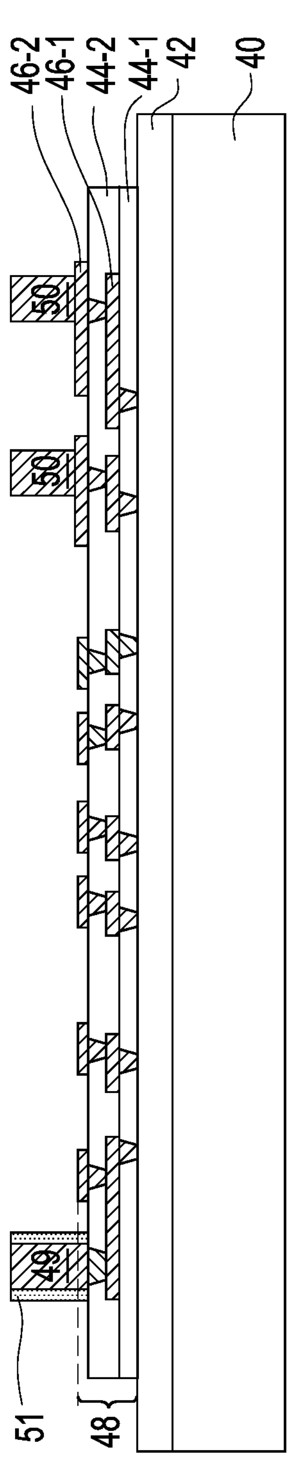

FIGS. 4D and 4E illustrate an alternate embodiment that describe an alternative method for forming the magnetic material 51 over the sidewalls of the conductive via 49, such that the magnetic material 51 surrounds and encircles an entirety of the sidewalls of the conductive via 49. In FIG. 4D, a patterned mask 41 (e.g., a photoresist) is formed over the structure shown in FIG. 2. The patterned mask 41 is formed so as to cover a top surface of the conductive via 49, top surfaces and sidewalls of the conductive vias 50, and top surfaces and sidewalls of the RDLs 46-2, while leaving the sidewalls of the conductive via 49 exposed. A plating process, a sputtering process, or the like may then be used to coat and encircle an entirety of the sidewalls of the conductive via 49 with the magnetic material 51. In this way the top surface of the conductive via 49 is not covered by any magnetic material 51. In FIG. 4E, the patterned mask 41 may then be removed by an acceptable ashing or stripping process, such as using an oxygen plasma or the like. The bonding of the plurality of dies to the RDLs 46 may then be performed as described in FIG. 4A.

Figure 5:
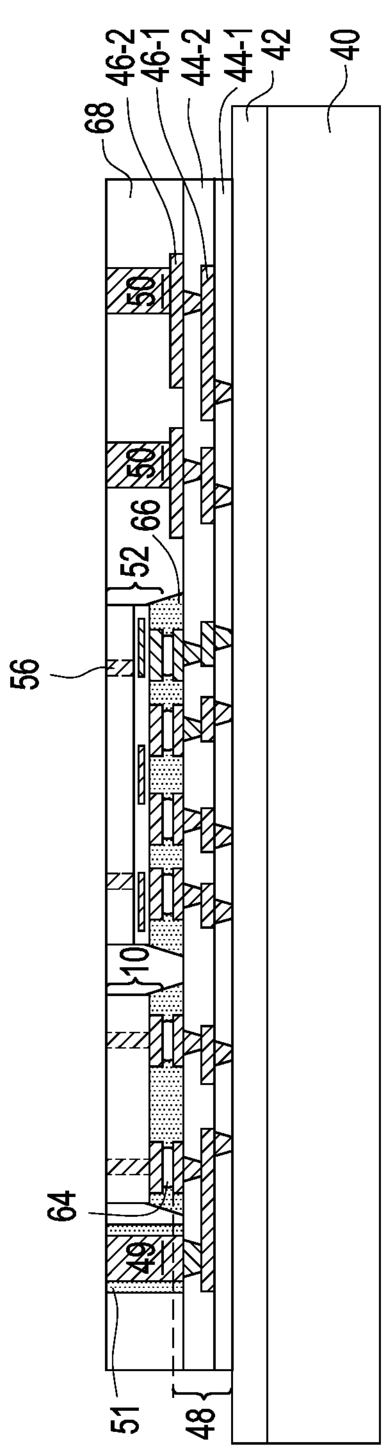

In FIG. 5, an encapsulant 68 is dispensed to encapsulate the discrete die 52, the IVR die 10, the conductive via 49 and the conductive vias 50. The encapsulant 68 fills the gaps between neighboring the conductive via 49, conductive vias 50, the IVR die 10, and the discrete die 52. The encapsulant 68 may include a molding compound, a molding underfill, an epoxy, and/or a resin. When the encapsulation is finished, a top surface of the encapsulant 68 is higher than the top surfaces of the conductive vias 50 and top surfaces of the discrete die 52 and the IVR die 10. In addition, the top surface of the encapsulant 68 is higher than a top surface of the magnetic material 51 over the conductive via 49. The encapsulant 68 may include a base material, which may be a polymer, a resin, an epoxy, or the like, and filler particles in the base material. The filler particles may be dielectric particles of silica, alumina, boron nitride, or the like, and may have spherical shapes.

A planarization process such as a Chemical Mechanical Polish (CMP) process or a mechanical grinding process is then performed to thin encapsulant 68, IVR die 10, and discrete die 52, until top surfaces of the conductive vias 50 are revealed. In addition, a portion of the magnetic material 51 over the conductive via 49 is also removed during the planarization process, leaving portions of the magnetic material 51 coated on sidewalls of the conductive via 49, as well as leaving the top surface of the conductive via 49 exposed. The magnetic material 51 surrounds and encircles an entirety of the sidewalls of the conductive via 49. The conductive vias 50 and the conductive via 49 may be alternatively referred to as through-vias since they penetrate through encapsulant 68. In accordance with some embodiments in which discrete die 52 and the IVR die 10 includes through-vias (e.g., the through-vias 56 of the discrete die 52), the through-vias are also revealed by the planarization process.

Figure 6:
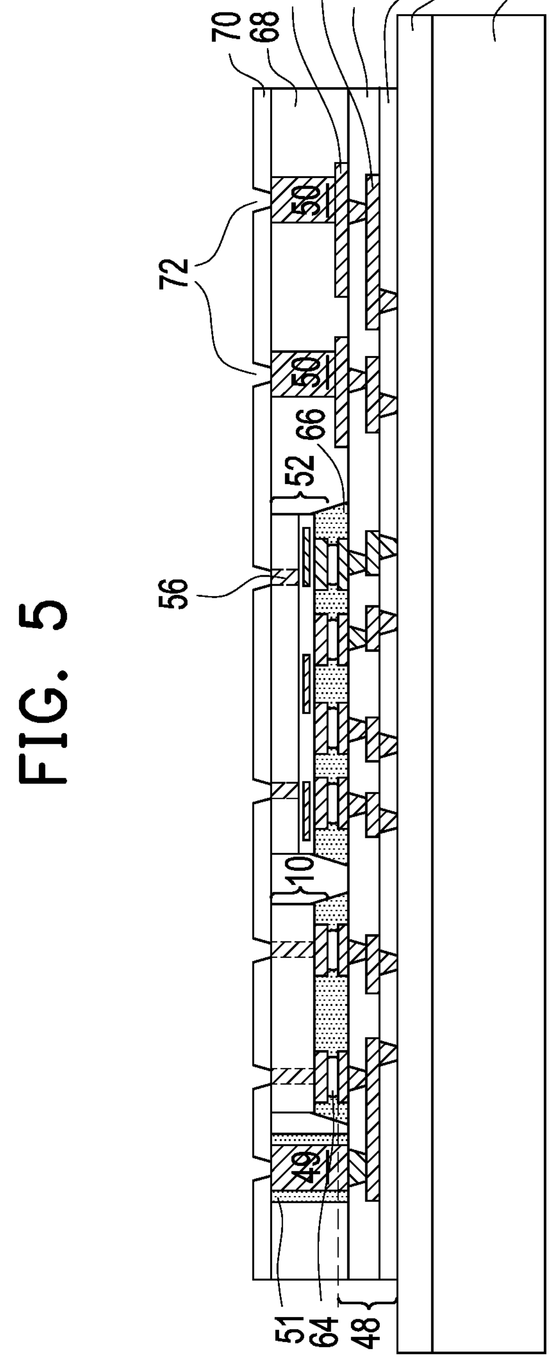

FIG. 6 illustrates the formation and the patterning of a dielectric layer 70 in accordance with some embodiments. The dielectric layer 70 may be part of the subsequently formed redistribution structure 74 (shown in FIG. 8). The dielectric layer 70 may be or may comprise an organic material such as a polymer, which may be a photo-sensitive polymer such as PBO, polyimide, or the like. The dielectric layer 70 may also be formed of or comprise an inorganic material such as silicon oxide, silicon nitride, or the like. The dielectric layer 70 may be formed using a process such as lamination, coating, (e.g., spin-coating), chemical vapor deposition (CVD), or the like.

The dielectric layer 70 is patterned using acceptable photolithography and etching techniques to form openings 72, with the conductive via 49, the conductive vias 50 and the through-vias of the discrete die 52 being exposed through the openings 72.

Figure 7:
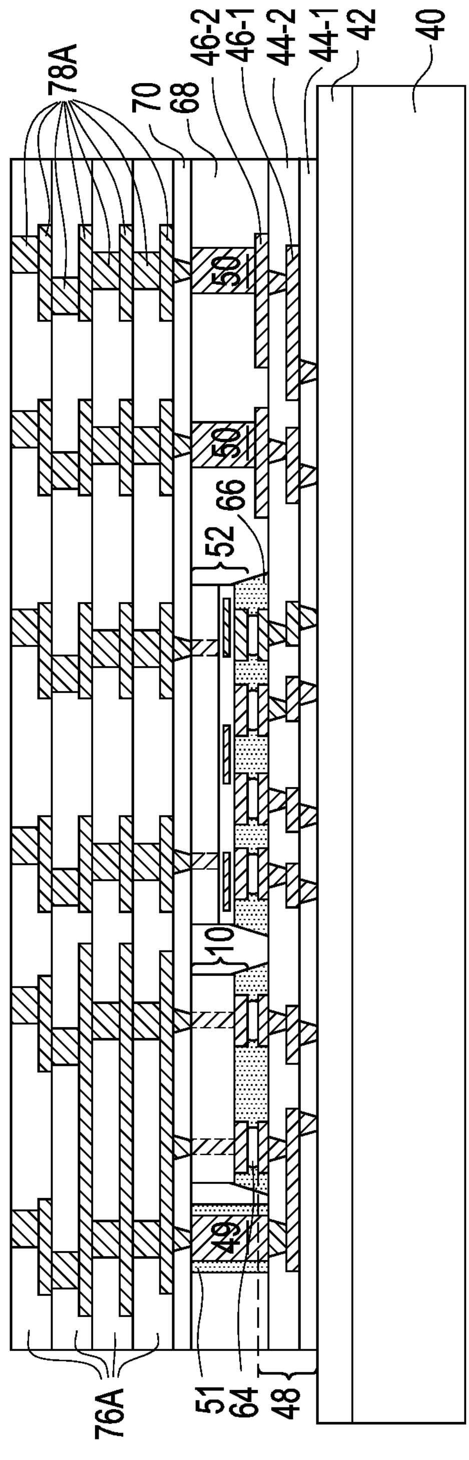
Figure 8:
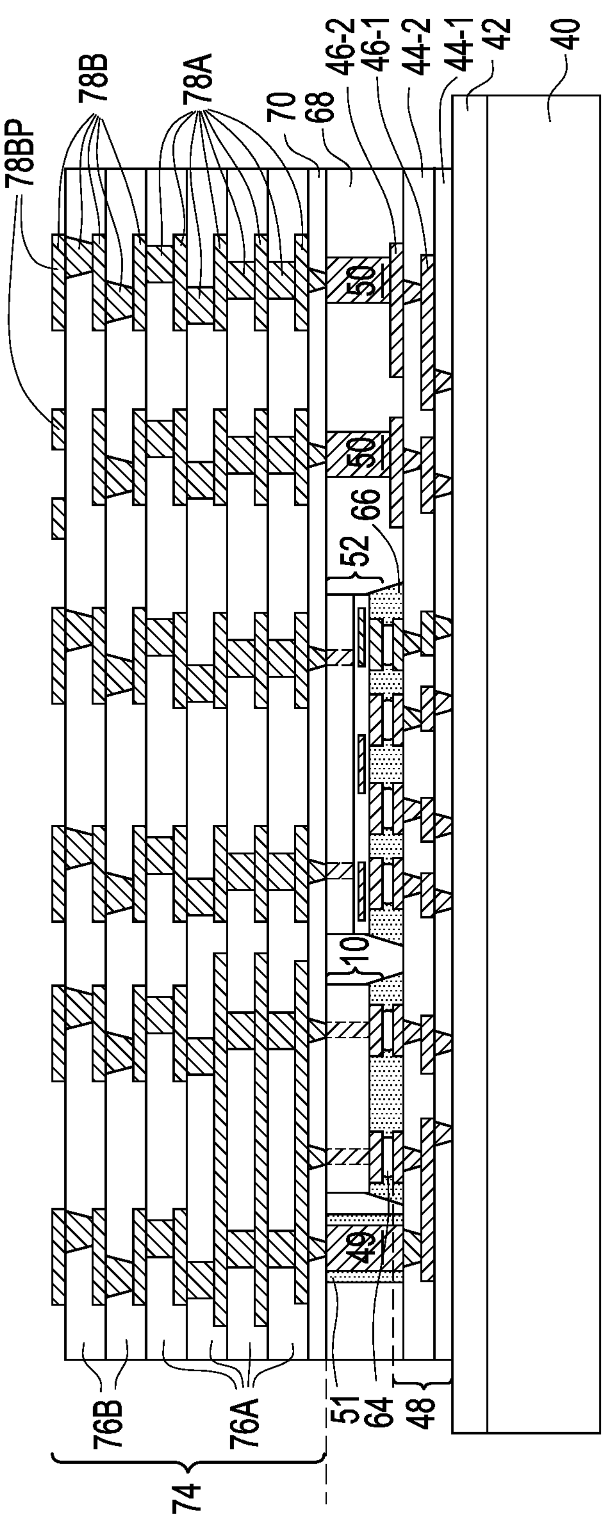

FIGS. 7 and 8 illustrate the formation of the redistribution structure 74 over discrete die 52 and the IVR die 10. In accordance with some embodiments, the redistribution structure 74 includes dielectric layers 76A and dielectric layers 76B over dielectric layers 76A. The dielectric layers 76A and the dielectric layers 76B may be formed of different materials and have different thicknesses. For example, each or some of the dielectric layers 76A may be thicker than each or some of the dielectric layers 76B. In accordance with some embodiments, the dielectric layers 76A are formed of a non-photo-sensitive material such as molding compound, molding underfill, silicon oxide, silicon nitride, or the like. The dielectric layers 76B, on the other hand, may be formed of a photo-sensitive material(s) such as PBO, polyimide, or the like. In accordance with alternative embodiments, both of the dielectric layers 76A and 76B are formed of photo-sensitive material(s). The dielectric layers 76A and 76B may be formed using a process such as lamination, coating, (e.g., spin-coating), chemical vapor deposition (CVD), atomic layer deposition (ALD), or the like.

RDLs 78A are formed in the dielectric layers 76A, and RDLs 78B are formed in the dielectric layers 76B. In accordance with some embodiments, the RDLs 78A are thicker and/or wider than the RDLs 78B, and may be used for long-range electrical routing, while the RDLs 78B may be used for short-range electrical routing. The RDLs 78A and 78B may comprise copper, or the like, and are electrically connected to the conductive via 49, the conductive vias 50 and the through-vias of the discrete die 52. In an embodiment, the RDLs 78A and 78B may be formed using different processes. For example, each RDL 78A may be formed by depositing a seed layer, after which a photoresist is placed and patterned on top of the seed layer in a desired pattern for the RDL 78A, and conductive material (e.g., copper, or the like) may then be formed in the patterned openings of the photoresist using e.g., a plating process. The photoresist may then be removed and the seed layer etched, forming the RDL 78A. Each RDL 78B may be formed by a damascene process. As an example of a damascene process, a dielectric layer 76B is formed, and then the dielectric layer 76B is etched to form openings according to a defined photoresist pattern. Then, a seed layer of copper is deposited conformally over the surface and in the openings of the dielectric layer 76B, after which an electroplating step or a deposition process is used to form conductive material (e.g., copper, or the like) in the openings of the RDL 78B. A planarization process is then performed to remove any excess conductive material and seed layer. Some surface conductive features 78BP are formed, which may be parts of the RDLs 78B, or may be separately formed Under-Bump Metallurgies (UBMs). In accordance with some embodiments, the RDLs 78A and 78B are electrically connected to the interconnect structure 48 through the conductive via 49, the conductive vias 50 and the through-vias 56 of the discrete die 52.

Figure 9:
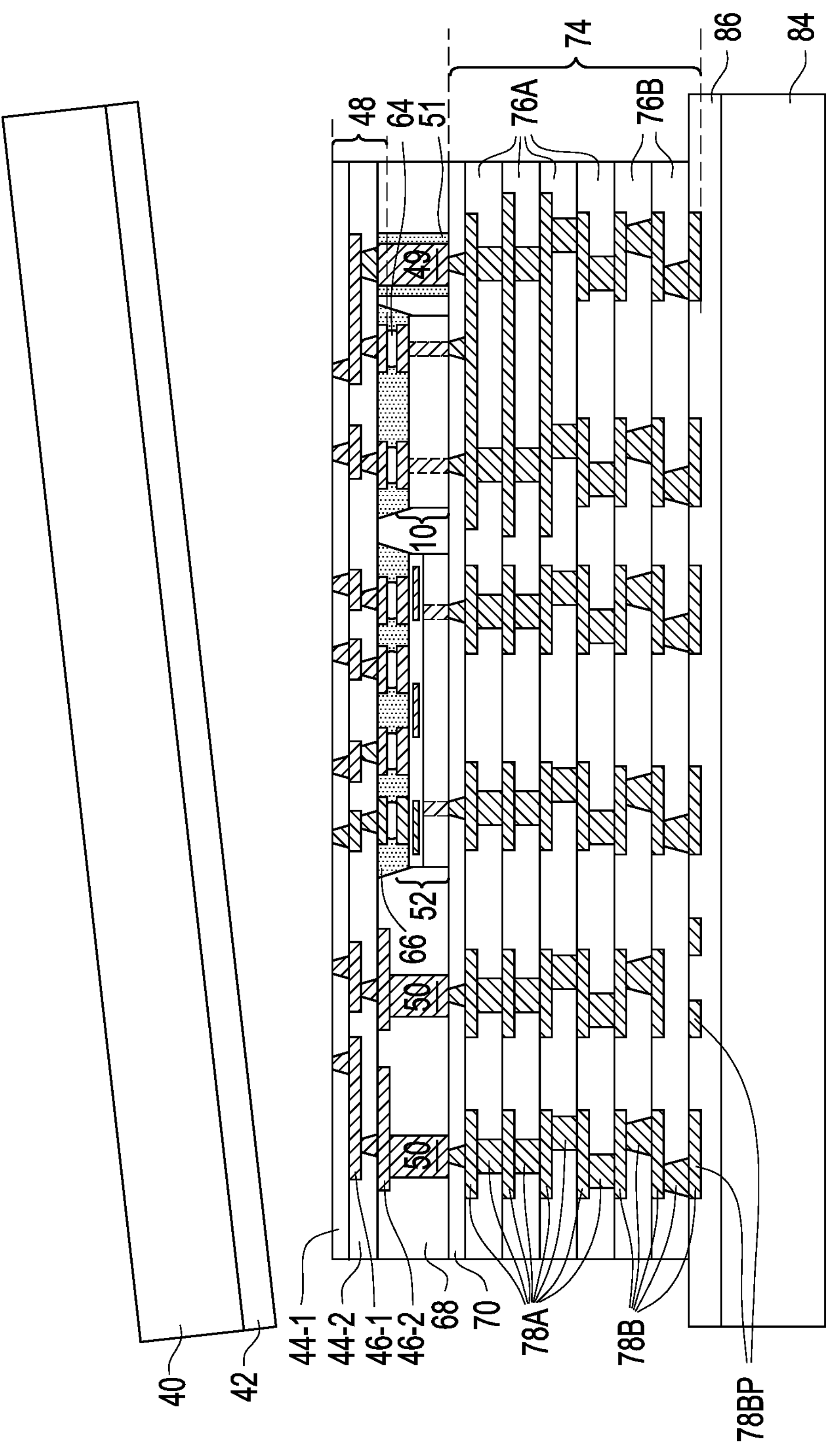

In a subsequent process, as shown in FIG. 9, a carrier-switch process is performed. In the carrier-switch process, the redistribution structure 74 is first attached to carrier 84 through release film 86. The carrier 84 is formed of a transparent material, and may be a glass carrier, a ceramic carrier, or the like. The release film 86 may be formed of an LTHC coating material. The carrier 40 is then de-bonded from the interconnect structure 48. In the de-bonding process, a light beam (which may be a laser beam) is projected on the release film 42, and the light beam penetrates through the transparent carrier 40. The release film 42 is thus decomposed. The carrier 40 may be lifted off from the release film 42, and hence the package 100 is de-bonded (demounted) from the carrier 40.

Figure 10:
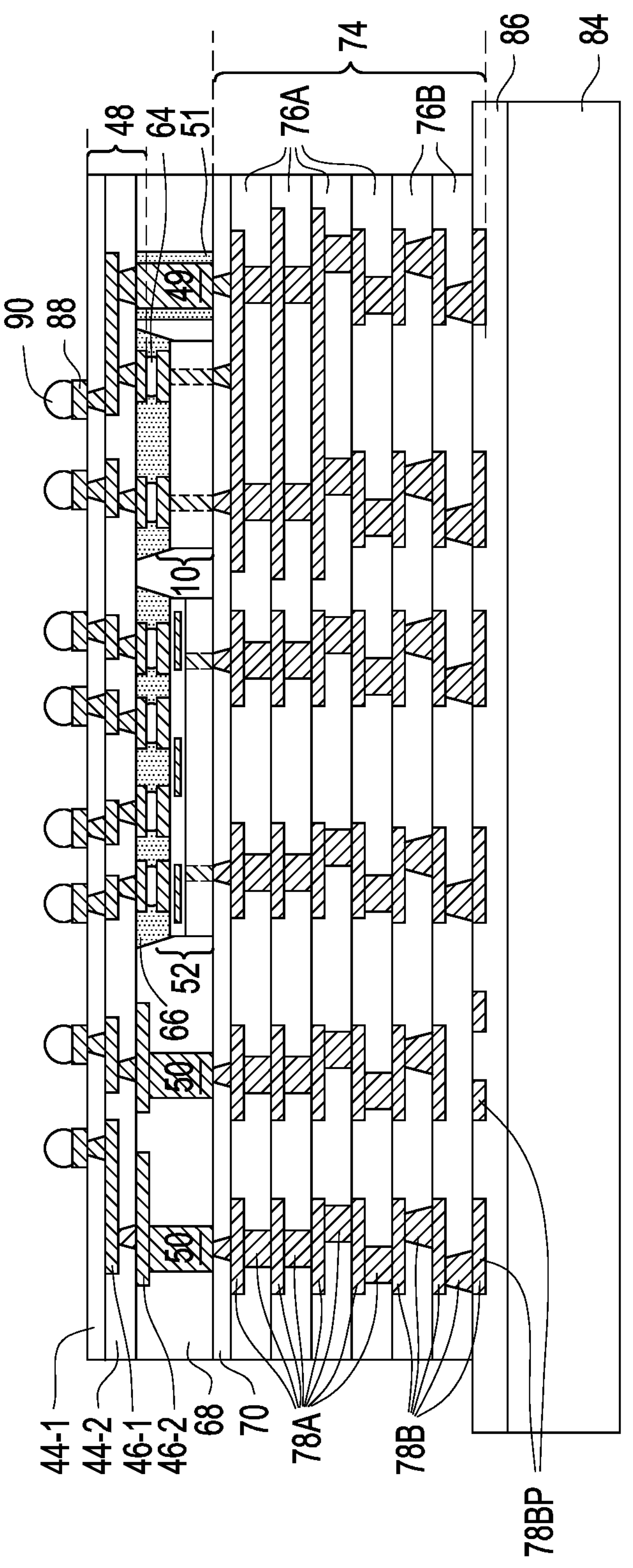

FIG. 10 illustrates the formation of UBMs 88 and conductive connectors 90 in accordance with some embodiments. The UBMs 88 may be formed of or comprise nickel, copper, titanium, or multi-layers thereof. The conductive connectors 90 are then formed on the UBMs 88. The formation of the conductive connectors 90 may include placing solder balls on the exposed portions of the UBMs 88, and then reflowing the solder balls, and hence the conductive connectors 90 are solder regions. In accordance with alternative embodiments of the present disclosure, the formation of the conductive connectors 90 includes performing a plating process to form solder layers, and then reflowing the solder layers. The conductive connectors 90 may also include non-solder metal pillars, or may have composite structures including metal pillars and solder caps over the non-solder metal pillars, which may also be formed through plating. Throughout the description, the structure over the release film 86 is referred to as composite interconnect structure 92.

Figure 11A:
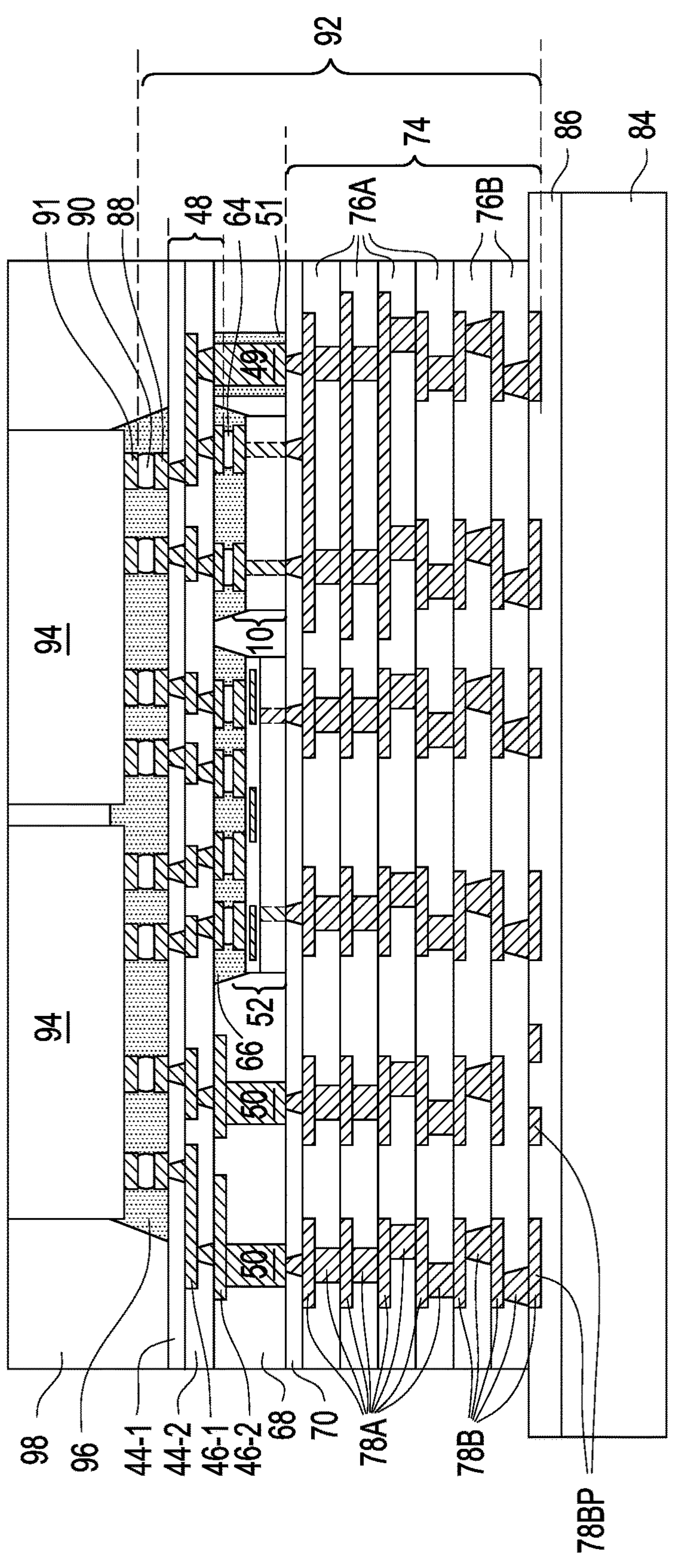
Figure 11B:
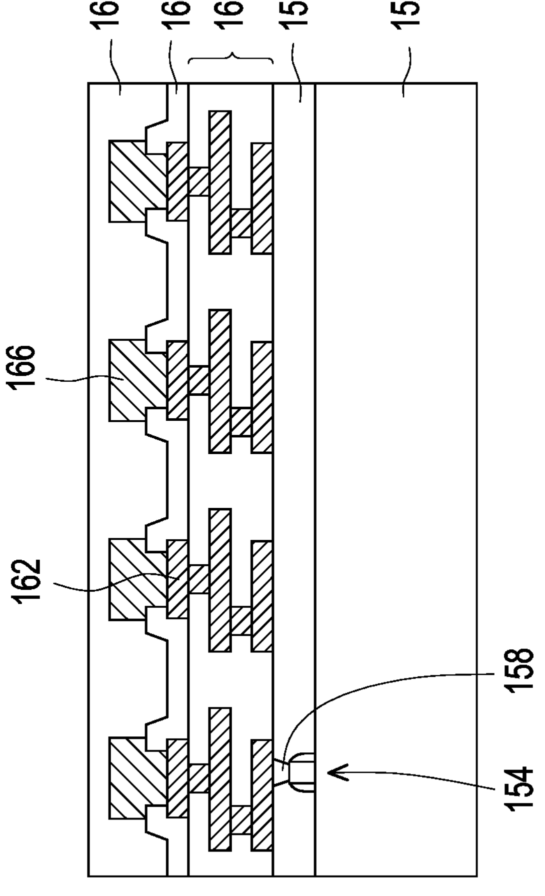
FIG. 11B illustrates a cross-sectional view of an integrated circuit die in accordance with some embodiments.

Referring to FIG. 11A, a plurality of package components 94 are bonded to composite interconnect structure 92. FIG. 11B illustrates a detailed view of an example package component 94 when the package component 94 is a semiconductor die. The package component 94 may be formed in a wafer, which may include different device regions that are singulated in subsequent steps to form a plurality of integrated circuit dies. The package component 94 may be processed according to applicable manufacturing processes to form integrated circuits. For example, the package component 94 includes a semiconductor substrate 152, such as silicon, doped or undoped, or an active layer of a semiconductor-on-insulator (SOI) substrate. The semiconductor substrate 152 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 152 has an active surface (e.g., the surface facing upwards in FIG. 11B), sometimes called a front side, and an inactive surface (e.g., the surface facing downwards in FIG. 11B), sometimes called a back side.

Devices (represented by a transistor) 154 may be formed at the front surface of the semiconductor substrate 152. The devices 154 may be active devices (e.g., transistors, diodes, etc.), capacitors, resistors, etc. An inter-layer dielectric (ILD) 156 is over the front surface of the semiconductor substrate 152. The ILD 156 surrounds and may cover the devices 154. The ILD 156 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 158 extend through the ILD 156 to electrically and physically couple the devices 154. For example, when the devices 154 are transistors, the conductive plugs 158 may couple the gates and source/drain regions of the transistors. Source/drain region(s) may refer to a source or a drain, individually or collectively dependent upon the context. The conductive plugs 158 may be formed of tungsten, cobalt, nickel, copper, silver, gold, aluminum, the like, or combinations thereof. An interconnect structure 160 is over the ILD 156 and conductive plugs 158. The interconnect structure 160 interconnects the devices 154 to form an integrated circuit. The interconnect structure 160 may be formed by, for example, metallization patterns in dielectric layers on the ILD 156. The metallization patterns include metal lines and vias formed in one or more low-k dielectric layers. The metallization patterns of the interconnect structure 160 are electrically coupled to the devices 154 by the conductive plugs 158.

The package component 94 further includes pads 162, such as aluminum pads, to which external connections are made. The pads 162 are on the active side of the package component 94, such as in and/or on the interconnect structure 160. One or more passivation films 164 are on the package component 94, such as on portions of the interconnect structure 160 and pads 162. Openings extend through the passivation films 164 to the pads 162. Die connectors 166, such as conductive pillars (for example, formed of a metal such as copper), extend through the openings in the passivation films 164 and are physically and electrically coupled to respective ones of the pads 162. The die connectors 166 may be formed by, for example, plating, or the like. The die connectors 166 electrically couple the respective integrated circuits of the package component 94.

Optionally, solder regions (e.g., solder balls or solder bumps) may be disposed on the pads 162. The solder balls may be used to perform chip probe (CP) testing on the package component 94. CP testing may be performed on the package component 94 to ascertain whether the package component 94 is a known good die (KGD). Thus, only package components 94, which are KGDs, undergo subsequent processing and are packaged, and dies, which fail the CP testing, are not packaged. After testing, the solder regions may be removed in subsequent processing steps.

A dielectric layer 168 may (or may not) be on the active side of the package component 94, such as on the passivation films 164 and the die connectors 166. The dielectric layer 168 laterally encapsulates the die connectors 166, and the dielectric layer 168 is laterally coterminous with the package component 94. Initially, the dielectric layer 168 may bury the die connectors 166, such that the topmost surface of the dielectric layer 168 is above the topmost surfaces of the die connectors 166. In some embodiments where solder regions are disposed on the die connectors 166, the dielectric layer 168 may bury the solder regions as well. Alternatively, the solder regions may be removed prior to forming the dielectric layer 168.

The dielectric layer 168 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 168 may be formed, for example, by spin coating, lamination, chemical vapor deposition (CVD), or the like. In some embodiments, the die connectors 166 are exposed through the dielectric layer 168 during formation of the package component 94. In some embodiments, the die connectors 166 remain buried and are exposed during a subsequent process for packaging the package component 94. Exposing the die connectors 166 may remove any solder regions that may be present on the die connectors 166.

Next, underfill 96 is dispensed into the gap between package components 94 and the underlying composite interconnect structure 92. Package components 94 are then encapsulated in encapsulant 98, which may include a molding compound, a molding underfill, or the like. The encapsulant 98 may include a base material, which may be a polymer, a resin, an epoxy, or the like, and filler particles in the base material. The filler particles may be dielectric particles of silica, alumina, boron nitride, or the like, and may have spherical shapes.

Figure 12:
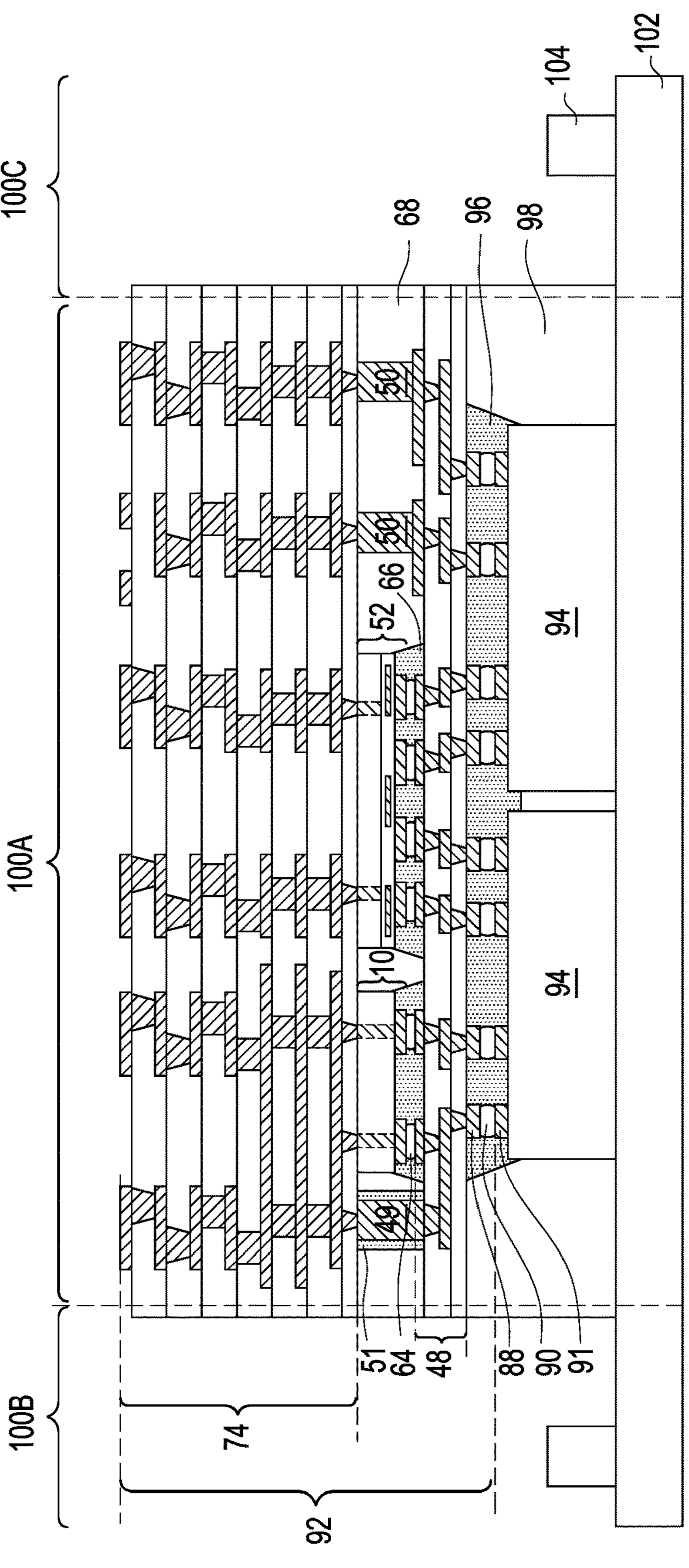
FIGS. 12-13 illustrate cross-sectional views of intermediate stages in the formation of a package including an inductor die in accordance with some embodiments.

In FIG. 12, the package 100 is de-bonded (demounted) from carrier 84. The de-bonding may be performed, for example, by projecting a light beam (which may be a laser beam) on release film 86, and the light beam penetrates through the transparent carrier 84. Release film 86 is thus decomposed. Carrier 84 is lifted off from release film 86, and hence the package 100 is de-bonded (demounted) from carrier 84. The resulting package 100 is shown in FIG. 12. The package 100 is then placed on tape 102, which may be fixed on a frame 104. In accordance with some embodiments, the package 100 is singulated in a sawing process, and is separated into a plurality of packages (e.g., packages 100A-C) that have structures identical to each other. In accordance with alternative embodiments, the sawing process is performed after the process shown in FIG. 13.

Figure 13:
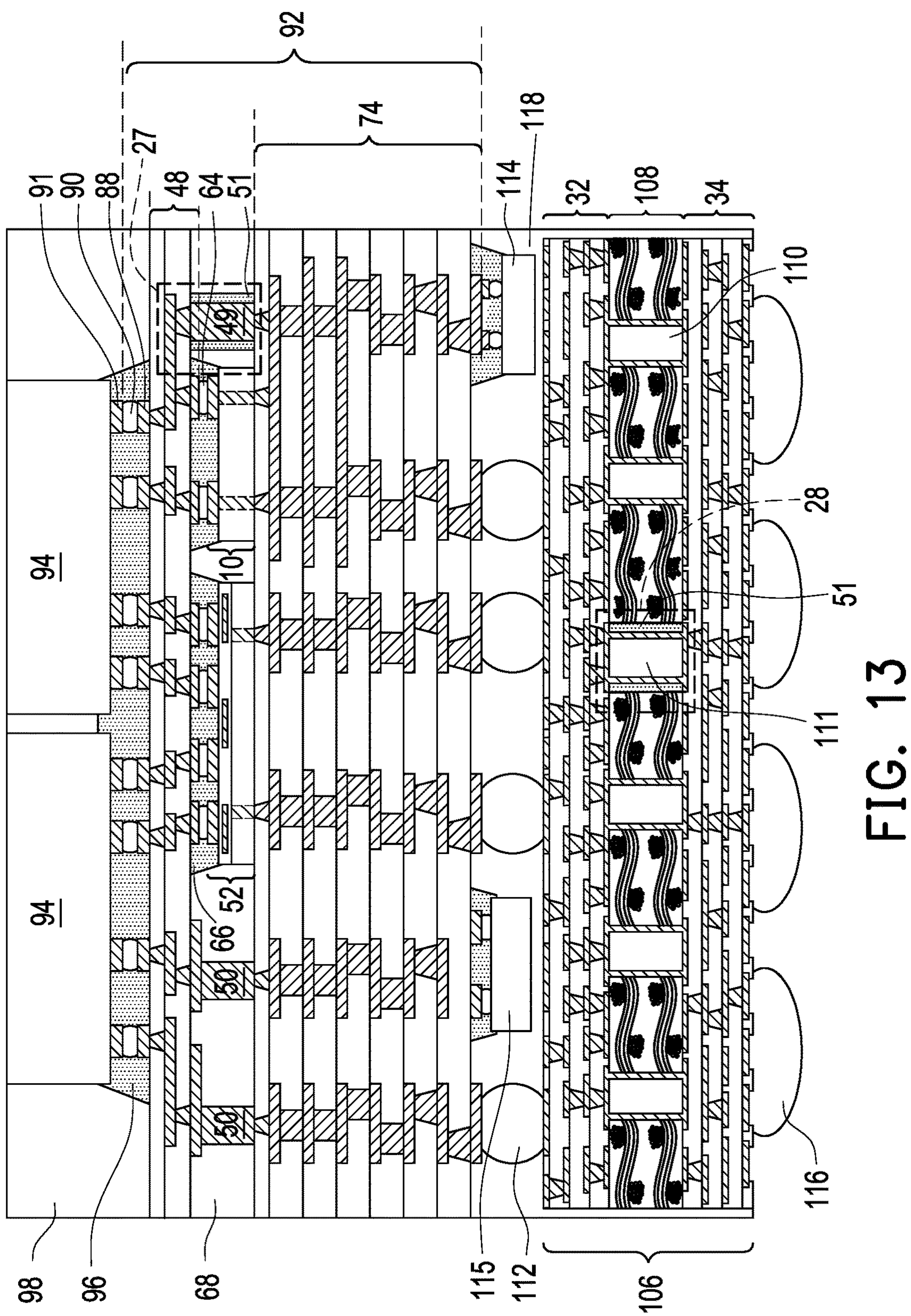

FIG. 13 illustrates the bonding of an IVR die 114, an IPD die 115, and package substrate 106 to the package 100. The IVR die 114 may be similar to the IVR die 10 described previously in FIG. 4B. The IPD die 115 may be a capacitor die, an inductor die, a resistor die, or the like. The package substrate 106 may include organic dielectric layers, and are sometimes referred to as organic package substrates. The package substrate 106 may also be cored package substrates including cores, or may be core-less package substrates that do not have cores therein. For example, the package substrate 106 may include a dielectric core 108, and plating through-holes (PTHs, which are conductive pipes) 110 therein. In addition, the package substrate 106 may include one or more PTHs 111 extending through the dielectric core 108, wherein the PTHs 111 may be similar in structure and dimensions as the PTH 110. The package substrate 106 may comprise routing structures 32 and 34 formed using dielectric layers and conductive routing layers within the dielectric layers. The routing structures 32 and 34 are formed on opposite sides of the dielectric core 108 and may provide additional electrical routing within the package substrate 106.

In accordance with alternative embodiments, the package substrate 106 is in an un-sawed wafer, and is bonded to package 100 through wafer-to-wafer bonding or die-to-wafer bonding (with packages 100 being in the die form). In accordance with alternative embodiments, the package substrate 106 is a discrete substrate, and is bonded to the package 100 through die-to-die bonding. The package substrate 106 is free from active devices such as transistors and diodes therein. The bonding may be achieved through solder regions 112. The solder regions 112 are formed by initially forming a layer of solder through evaporation, electroplating, printing, solder transfer, ball placement, or the like. Once a layer of solder has been formed on the structure, a reflow may be performed in order to shape the material into the desired bump shapes. The package substrate 106 may also comprise conductive connectors 116 that may be ball grid array (BGA) connectors, solder balls, or the like. The conductive connectors 116 may be used to input electrical signals to the package 100. The conductive connectors 116 may include a conductive material such as solder, copper, aluminum, gold, nickel, silver, palladium, tin, the like, or a combination thereof.

The package substrate 106 comprises a PTH 111, wherein magnetic material 51 surrounds and encircles an entirety of the outer sidewalls of the PTH 111. In this way the magnetic material 51 is disposed between sidewalls of the first PTH 111 and the dielectric core 108.

Underfill 118 is dispensed into the gaps between the package substrate 106 and the composite interconnect structure 92, such as around the solder regions 112, the IVR die 114, and the IPD die 115. In addition, the underfill 118 is dispensed so as to be disposed on sidewalls of the package substrate 106. In accordance with some embodiments, the underfill 118 may include a base material, which may include a polymer, a resin, an epoxy, and/or the like, and filler particles in the base material. The filler particles may be dielectric particles of silica, alumina, boron nitride, or the like, and may have spherical shapes. The underfill 118 may physically isolate the IVR die 114 from the package substrate 106.

In accordance with some embodiments, the IVR die 10 and the discrete die 52 are embedded in the composite interconnect structure 92. The IVR die 10 and the discrete die 52 are electrically and signally connected to the package components 94. The conductive via 49 and the encircling magnetic material 51 collectively form an inductor 27. This inductor 27 is embedded in the encapsulant 68 and is adjacent to and electrically connected to the IVR die 10. An electrical signal input through the conductive connectors 116 is transmitted to the inductor 27 through the redistribution structure 74, where this electrical signal undergoes a first voltage regulation. After the first voltage regulation, the electrical signal is further transmitted to the IVR die 10 through the redistribution structure 48, where it undergoes a second voltage regulation. This double regulation results in better voltage regulation of the signal before this electrical signal is transmitted to the overlying plurality of package components 94.

In addition, The IVR die 114 is electrically and signally connected to the package components 94. The PTH 111 and the encircling magnetic material 51 collectively form an inductor 28. This inductor 28 is embedded in the dielectric core 108 and is electrically connected to the IVR die 114, wherein the inductor 28 is disposed below the IVR die 114. An electrical signal input through the conductive connectors 116 is transmitted to the inductor 28, where this electrical signal undergoes a first voltage regulation. After the first voltage regulation, the electrical signal is further transmitted to the IVR die 114 through the redistribution structure 74, where it undergoes a second voltage regulation. This double regulation results in better voltage regulation of the signal before this electrical signal is transmitted to the overlying plurality of package components 94 through the redistribution structure 48 and the redistribution structure 74.

Advantages can be achieved as a result of forming the package 100 that includes the conductive via 49 having sidewalls coated and encircled with the magnetic material 51. The conductive via 49 and the magnetic material 51 collectively form the inductor 27 that is adjacent to and electrically connected to the IVR die 10. The package 100 may comprise the package substrate 106. Outer sidewalls of the PTH 111 of the package substrate 106 may also be coated and encircled with the magnetic material 51. The PTH 111 and the magnetic material 51 collectively form the inductor 28 that is electrically connected to the IVR die 114 disposed above the PTH 111. Advantageous features of one or more embodiments disclosed herein may allow the coated conductive via 49 and the coated PTH 111 to act as inductors to enhance voltage regulation and improve electrical performance of the package 100. In addition, the PTH 111 being disposed beneath the IVR die 114 allows for better voltage input control to the IVR die 114.

Figure 14:
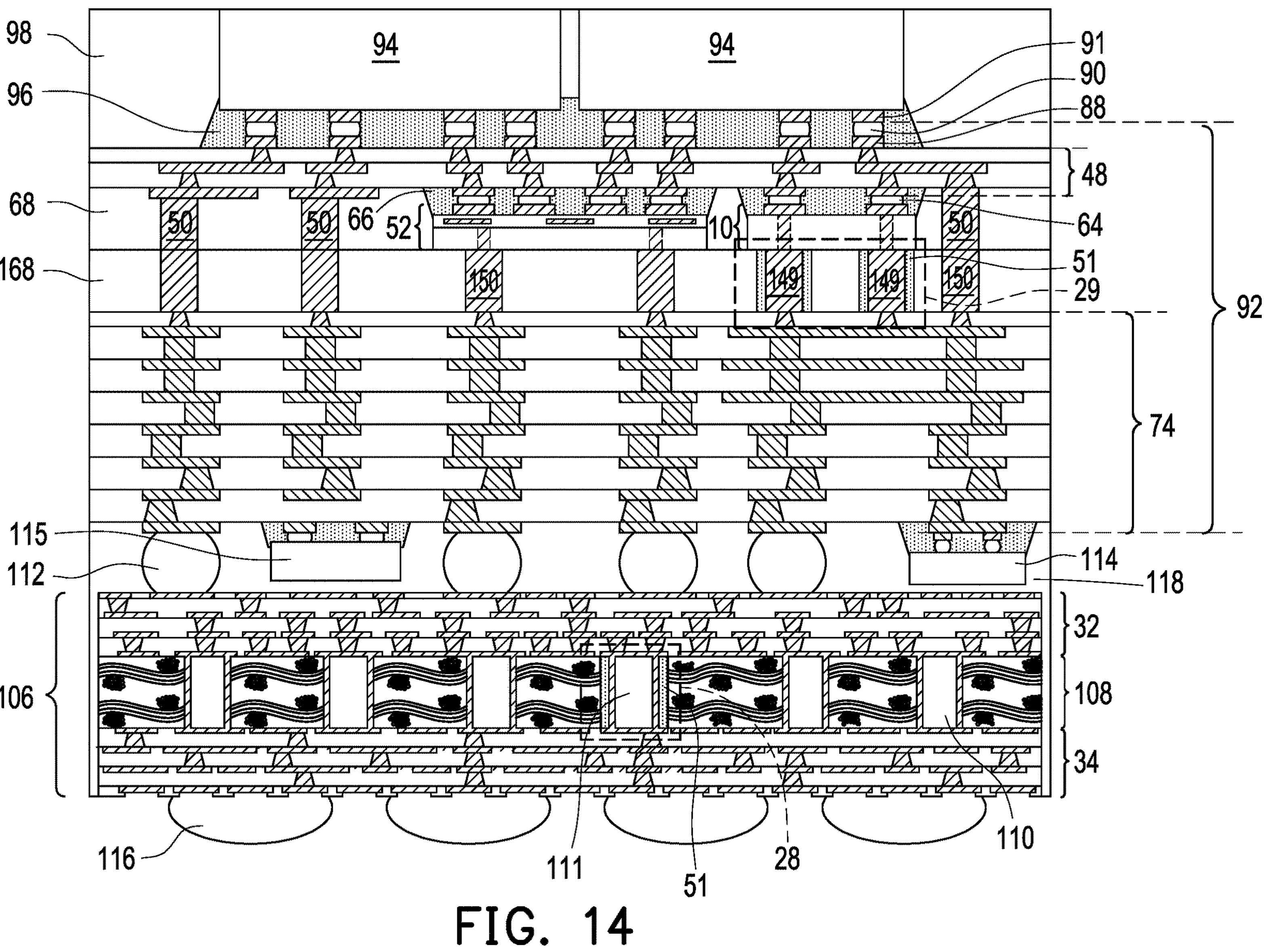
FIG. 14 illustrates a cross-sectional view of an intermediate stage in the formation of a package including an inductor die in accordance with alternate embodiments.

FIG. 14 illustrates a package 200 in accordance with an alternative embodiment. Unless specified otherwise, like reference numerals in this embodiment (and subsequently discussed embodiments) represent like components in the embodiment shown in FIGS. 1 through 13 formed by like processes. Accordingly, the process steps and applicable materials may not be repeated herein.

The package 200 illustrated in FIG. 14 differs from the package 100 illustrated in FIGS. 1 through 13 in that there are no conductive vias 49 having sidewalls coated and encircled with the magnetic material 51 adjacent to the IVR die 10. For example, there are no inductors (such as inductor 27, see FIG. 13) that are disposed at a same level as the IVR die 10. However, the package 200 comprises an encapsulant 168 disposed below the encapsulant 68, the IVR die 10, and the discrete die 52. The encapsulant 168 is disposed between the encapsulant 68 and the redistribution structure 74. Encapsulant 168 may include a molding compound, a molding underfill, an epoxy, and/or a resin. Encapsulant 168 may include a base material, which may be a polymer, a resin, an epoxy, or the like, and filler particles in the base material. The filler particles may be dielectric particles of silica, alumina, boron nitride, or the like, and may have spherical shapes. In an embodiment, the encapsulant 68 and the encapsulant 168 may be formed of similar materials and using similar processes.

Conductive vias 149 and conductive vias 150 are formed to extend through the encapsulant 168. The conductive vias 149 and the conductive vias 150 may be in physical contact with and electrically connect the conductive vias 50, the discrete die 52, and the IVR die 10 to the redistribution structure 74. The conductive vias 149 and the conductive vias 150 may be formed using similar processes and similar materials as those used to form the conductive vias 50. For example, the formation of the conductive vias 149 and the conductive vias 150 may include depositing a metal seed layer over the encapsulant 68, the conductive vias 50, the IVR die 10, and the discrete die 52, and forming a patterned plating mask, through which some portions of the metal seed layer are exposed. In accordance with some embodiments, the metal seed layer may include a copper layer, a titanium layer and a copper layer over the titanium layer, or the like. A plating process is then performed to plate a metallic material (e.g., copper, or the like) into the openings in the plating mask. The plating process may be performed using, for example, an electrochemical plating process or an electro-less plating process. The plating mask is then removed, followed by the etching of the exposed portions of the metal seed layer to form the conductive vias 149 and the conductive vias 150. The conductive vias 149 may be formed over and in physical contact with the through-vias of the IVR die 10, and the conductive vias 150 may be formed over and in physical contact with the through-vias 56 of the discrete die 52. The conductive vias 150 are also formed over and in physical contact with the conductive vias 50. Although two of the conductive vias 149 are shown in FIG. 14, any number of conductive vias 149 may be formed over and electrically connected to the IVR die 10.

Magnetic material 51 is formed to surround and encircle an entirety of the sidewalls of each of the conductive vias 149. The IVR die 10 and the discrete die 52 are electrically and signally connected to the package components 94. The conductive via s 149 and the encircling magnetic material 51 around each of the conductive vias 149 collectively form an inductor 29. This inductor 29 is embedded in the encapsulant 168 and is electrically connected to the IVR die 10 that is disposed above the inductor 29. An electrical signal input through the conductive connectors 116 is transmitted to the inductor 29 through the redistribution structure 74, where this electrical signal undergoes a first voltage regulation. After the first voltage regulation, the electrical signal is further transmitted to the IVR die 10 through the conductive vias 149 and the through-vias of the IVR die 10, where it undergoes a second voltage regulation. This double regulation results in better voltage regulation of the signal before this electrical signal is transmitted to the overlying plurality of package components 94.

Advantages can be achieved as a result of forming the package 200 that includes the conductive vias 149 having sidewalls coated and encircled with the magnetic material 51. The conductive vias 149 and the magnetic material 51 collectively form the inductor 29 that is electrically connected to the IVR die 10. The inductor 29 is embedded in the encapsulant 168, and is disposed below and is overlapped by the IVR die 10, wherein the conductive vias 149 are in physical contact with the through-vias of the IVR die 10. Advantageous features of one or more embodiments disclosed herein may allow the coated conductive vias 149 to act as an inductor to enhance voltage regulation and improve electrical performance of the package 100. In addition, the inductor 29 being disposed beneath and overlapped by the IVR die 114 allows for better voltage input control to the IVR die 10.

Figure 15:
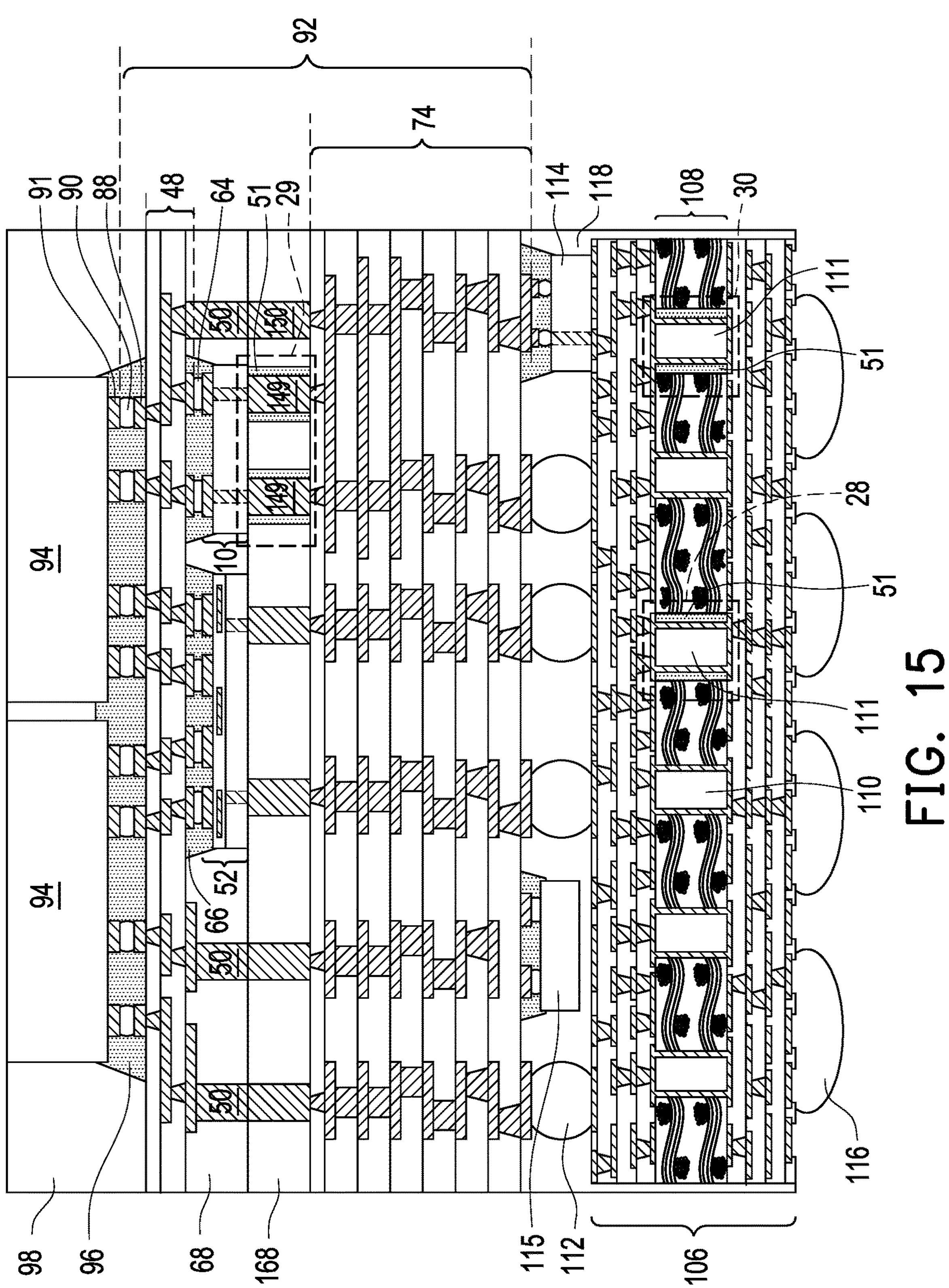
FIG. 15 illustrates a cross-sectional view of an intermediate stage in the formation of a package including an inductor die in accordance with alternate embodiments.

FIG. 15 illustrates a package 300 in accordance with an alternative embodiment. Unless specified otherwise, like reference numerals in this embodiment (and subsequently discussed embodiments) represent like components in the embodiments shown in FIGS. 1 through 14 formed by like processes. Accordingly, the process steps and applicable materials may not be repeated herein.

The package 300 illustrated in FIG. 15 differs from the package 200 illustrated in FIG. 14 in that the package 300 also comprises an additional PTH 111, wherein magnetic material 51 surrounds and encircles an entirety of the outer sidewalls of the additional PTH 111. In this way the magnetic material 51 is disposed between sidewalls of the PTH 111 and the dielectric core 108. The additional PTH 111 and the encircling magnetic material 51 collectively form an inductor 30. The IVR die 114 is electrically and signally connected to the package components 94. This inductor 30 is embedded in the dielectric core 108 and is electrically connected to the IVR die 114 through the through-vias of the IVR die 114 and the routing structures 32, wherein the inductor 30 is disposed below and is overlapped by the IVR die 114. The conductive routing layers of the routing structures 32 may be in physical contact with the through-vias of the IVR die 114. An electrical signal input through the conductive connectors 116 is transmitted to the inductor 30, where this electrical signal undergoes a first voltage regulation. After the first voltage regulation, the electrical signal is further transmitted to the IVR die 114 through the routing structures 302 and the through-vias of the IVR die 114, where it undergoes a second voltage regulation. This double regulation results in better voltage regulation of the signal before this electrical signal is transmitted to the overlying plurality of package components 94 through the redistribution structure 48 and the redistribution structure 74.

Advantages can be achieved as a result of forming the package 300 that includes outer sidewalls of the additional PTH 111 of the package substrate 106 being coated and encircled with the magnetic material 51. The additional PTH 111 and the magnetic material 51 collectively form the inductor 30 that is electrically connected to the IVR die 114 that is disposed above and overlaps the additional PTH 111. Advantageous features of one or more embodiments disclosed herein may allow the coated additional PTH 111 to act as an inductor to enhance voltage regulation and improve electrical performance of the package 300. In addition, the additional PTH 111 being disposed beneath and being overlapped by the IVR die 114 allows for better voltage input control to the IVR die 114.

Figure 16A:
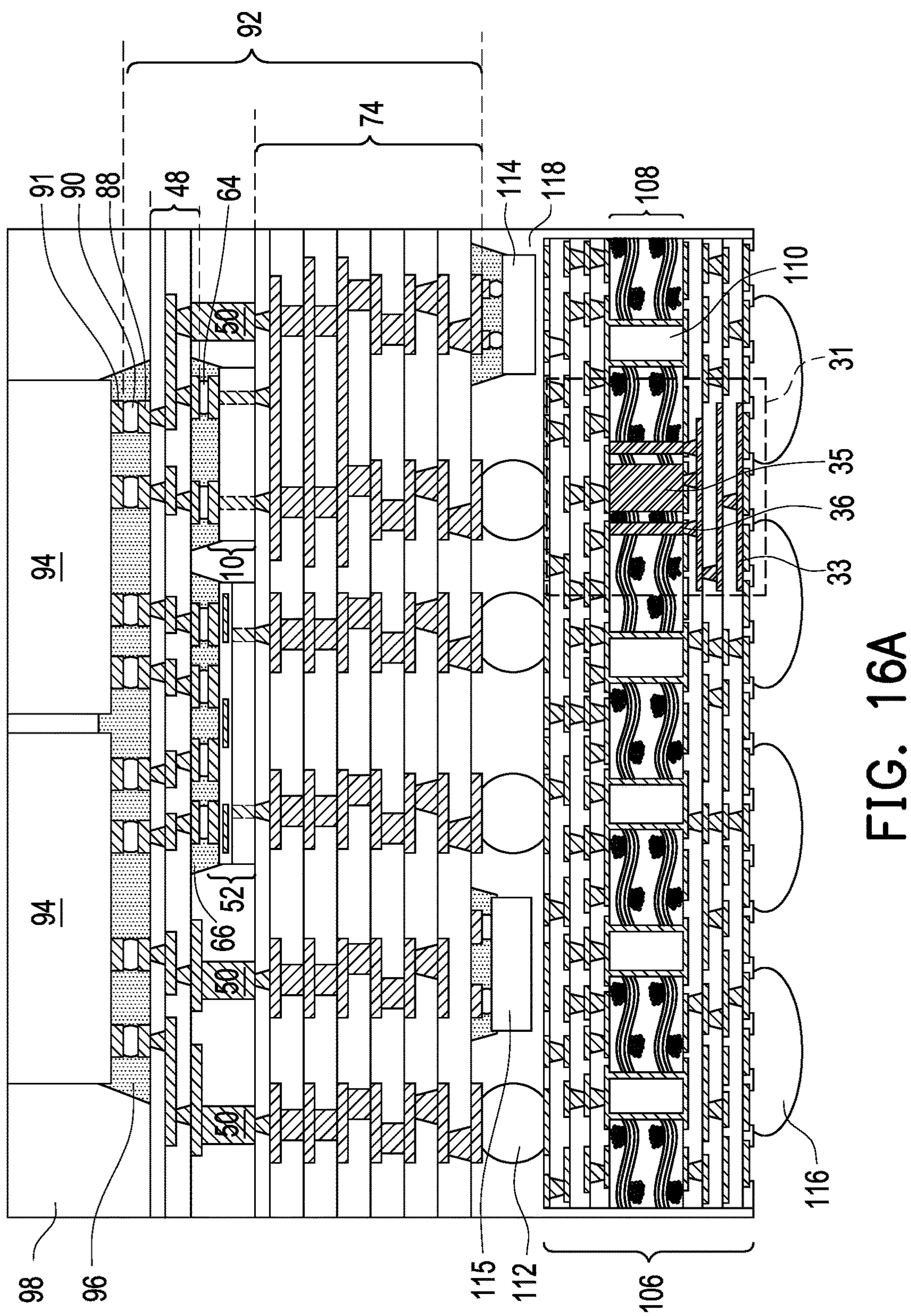
FIG. 16A illustrates a cross-sectional view of an intermediate stage in the formation of a package including an inductor die in accordance with alternate embodiments.

FIG. 16A illustrates a package 400 in accordance with an alternative embodiment. Unless specified otherwise, like reference numerals in this embodiment (and subsequently discussed embodiments) represent like components in the embodiment shown in FIGS. 1 through 13 formed by like processes. Accordingly, the process steps and applicable materials may not be repeated herein.

The package 400 illustrated in FIG. 16A differs from the package 100 illustrated in FIGS. 1 through 13 in that there is are no conductive vias 49 having sidewalls coated and encircled with the magnetic material 51 adjacent to the IVR die 10. For example, there are no inductors (such as inductor 27, see FIG. 13) that are disposed at a same level as the IVR die 10. However, the package 400 comprise through-via 35 and through-vias 36 that extend through the dielectric core 108 of the package substrate 106. The package 400 also comprises a coil structure 33 (also referred to as a RDL coil subsequently) that is embedded in the routing structure 34 below and overlapped by the through-vias 35 and 36. The RDL coil 33 is electrically connected to the through-vias 35 and 36. The RDL coil 33 and the through-vias 35 and 36 may be formed from a conductive metal, e.g., copper, or the like. In an embodiment, the underfill 118 may physically isolate the IVR die 114 from the package substrate 106.

Figure 16B:
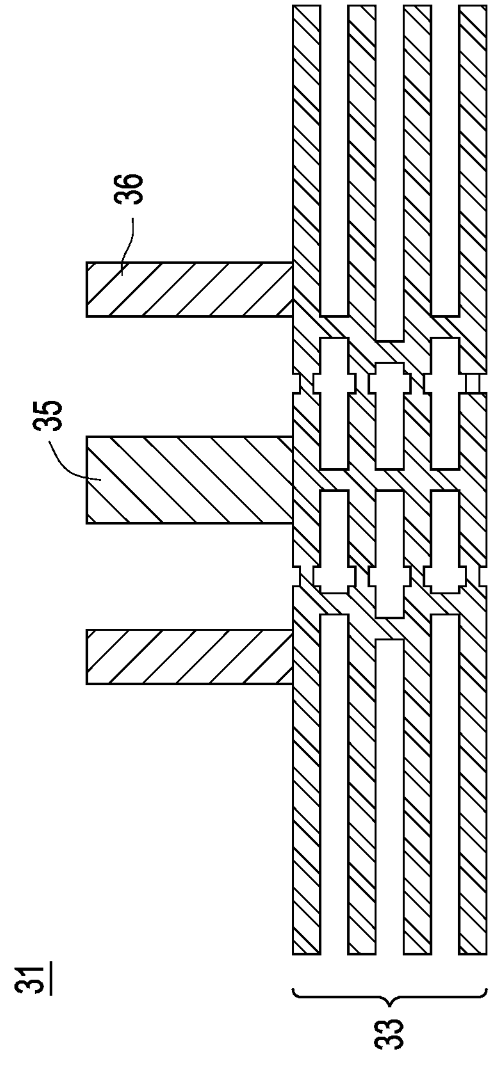
FIG. 16B illustrates a side view of an inductor in accordance with some embodiments.

The RDL coil 33 and the through-vias 35 and 36 collectively form an inductor 31. The inductor 31 can also be referred to as an air inductor since there is no magnetic core made of a ferromagnetic material disposed between the coils of the RDL coil 33. Rather, the RDL coil 33 coils are embedded in the dielectric layers of the routing structure 34. This inductor 31 is electrically connected to the IVR die 114 that is disposed above the inductor 31. As seen from the side view of the inductor 31 illustrated in FIG. 16B, the through-via 35 serves as an electrical signal output for the inductor 31 and the through-vias 36 serve as an electrical signal input for the inductor 31. An applied signal input through the conductive connectors 116 is transmitted to the inductor 31, where this electrical signal undergoes a first voltage regulation. After the first voltage regulation, the electrical signal is further transmitted to the IVR die 114 through the redistribution structure 74, where it undergoes a second voltage regulation. This double regulation results in better voltage regulation of the signal before this electrical signal is transmitted to the overlying plurality of package components 94 through the redistribution structure 74.

Advantages can be achieved as a result of forming the package 400 that includes the RDL coil 33 and the through-vias 35 and 36 to collectively form the inductor 31. The RDL coil 33 is embedded in the routing structure 34, and the inductor 31 is disposed below the IVR die 114. Advantageous features of one or more embodiments disclosed herein may allow the RDL coil 33 and the through-vias 35 and 36 to act as an inductor to enhance voltage regulation and improve electrical performance of the package 400. In addition, the inductor 31 being disposed beneath the IVR die 114 allows for better voltage input control to the IVR die 114.

Figure 17:
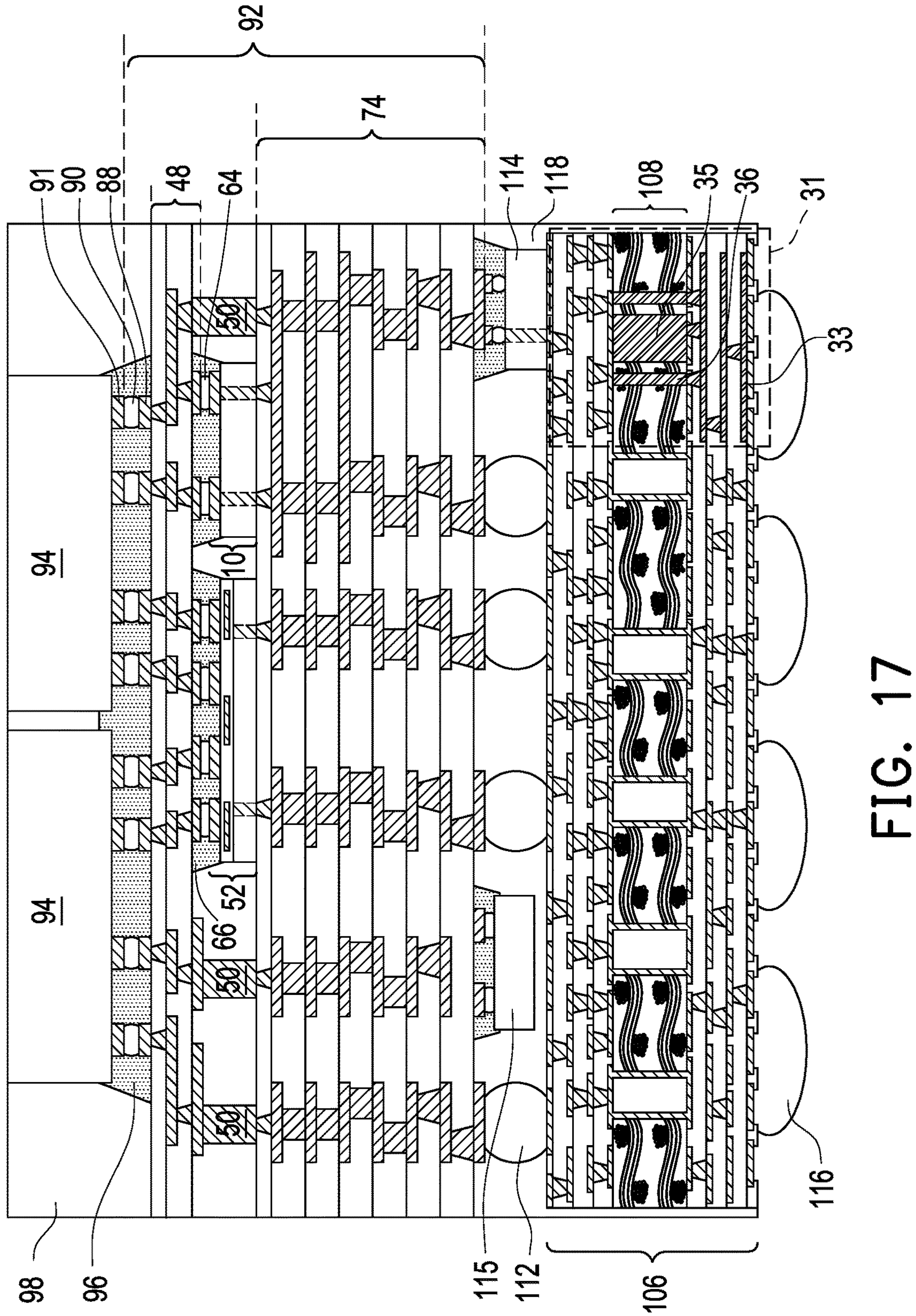
FIG. 17 illustrates a cross-sectional view of an intermediate stage in the formation of a package including an inductor die in accordance with alternate embodiments.

FIG. 17 illustrates a package 500 in accordance with an alternative embodiment. Unless specified otherwise, like reference numerals in this embodiment (and subsequently discussed embodiments) represent like components in the embodiment shown in FIGS. 1 through 16 formed by like processes. Accordingly, the process step s and applicable materials may not be repeated herein.

The package 500 illustrated in FIG. 17 differs from the package 400 illustrated in FIG. 16A in that the inductor 31 comprising the through-via 35 and the through-vias 36 and the coil structure 33 (also referred to as a RDL coil subsequently) is disposed to be directly below and overlapped by the IVR die 114. The RDL coil 33 is embedded in the dielectric layers of the routing structure 34 and is electrically connected to the through-vias 35 and 36.

The inductor 31 is electrically connected to the IVR die 114 using the through-vias of the IVR die 114 and the routing structures 32. The through-vias of the IVR die 114 are in physical contact with a conductive routing layer of the routing structure 32. The through-via 35 serves as an electrical signal output for the inductor 31 and the through-vias 36 serve as an electrical signal input for the inductor 31. An applied signal input through the conductive connectors 116 is transmitted to the inductor 31, where this electrical signal undergoes a first voltage regulation. After the first voltage regulation, the electrical signal is further transmitted to the IVR die 114 through the routing structure 32 and the through-vias of the IVR die, where it undergoes a second voltage regulation. This double regulation results in better voltage regulation of the signal before this electrical signal is transmitted to the overlying plurality of package components 94 through the redistribution structure 74.

Advantages can be achieved as a result of forming the package 500 that includes the RDL coil 33 and the through-vias 35 and 36 to collectively form the inductor 31. The RDL coil 33 is embedded in the routing structure 34, and the inductor 31 is electrically connected to the IVR die 114 that is disposed above and overlaps the first the inductor 31. Advantageous features of one or more embodiments disclosed herein may allow the RDL coil 33 and the through-vias 35 and 36 to act as an inductor to enhance voltage regulation and improve electrical performance of the package 500. In addition, the inductor 31 being disposed beneath and being overlapped by the IVR die 114 allows for better voltage input control to the IVR die 114.

Figure 18:
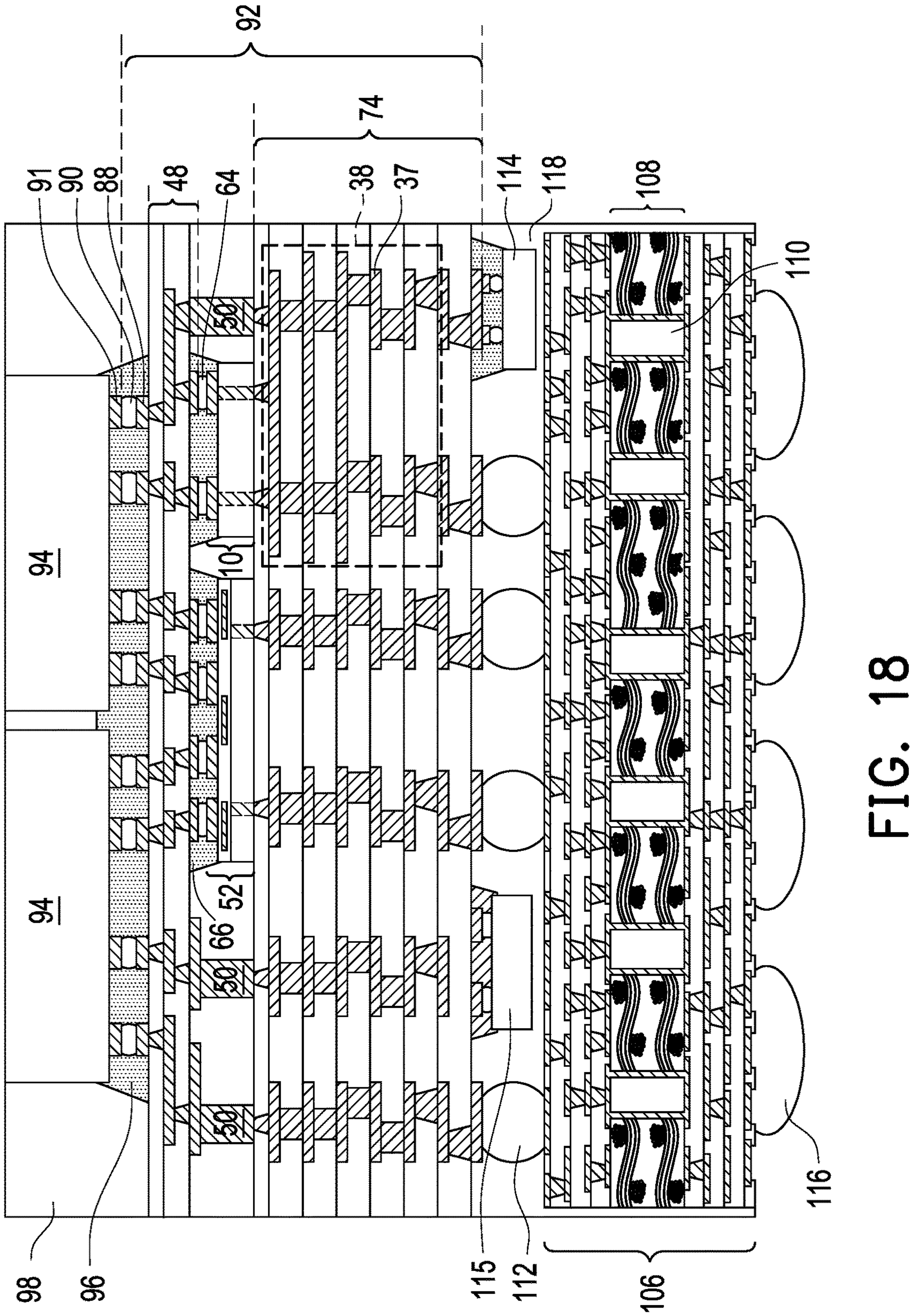
FIG. 18 illustrates a cross-sectional view of an intermediate stage in the formation of a package including an inductor die in accordance with alternate embodiments.

FIG. 18 illustrates a package 600 in accordance with an alternative embodiment. Unless specified otherwise, like reference numerals in this embodiment (and subsequently discussed embodiments) represent like components in the embodiment shown in FIGS. 1 through 13 formed by like processes. Accordingly, the process steps and applicable materials may not be repeated herein.

The package 600 illustrated in FIG. 18 differs from the package 100 illustrated in FIGS. 1 through 13 in that there are no conductive vias 49 having sidewalls coated and encircled with the magnetic material 51 adjacent to the IVR die 10. For example, there are no inductors (such as inductor 27, see FIG. 13) that are disposed at a same level as the IVR die 10. However, the package 600 comprises a coil structure 37 (also referred to as a RDL coil subsequently) that is embedded in the dielectric layers 76A of the redistribution structure 74. The coil structure 37 is formed during the formation of the redistribution structure 74 (described previously in FIGS. 7 and 8), and is formed using similar materials and using same processes as those used in the formation of the RDLs 78A.

The RDL coil 37 embedded in the dielectric layers 76A forms an inductor 38. The inductor 38 can also be referred to as an air inductor since there is no magnetic core made of a ferromagnetic material disposed between the coils of the RDL coil 37. Rather, the RDL coil 37 is embedded in the dielectric layers of the redistribution structure 74. This inductor 38 is electrically connected to the IVR die 10 that is disposed above and overlaps the inductor 38. The RDL coil 37 is electrically connected to the IVR die 10 using through-vias in the IVR die 10 and a conductive via in the dielectric layer 70 of the redistribution structure 74. An applied signal input through the conductive connectors 116 is transmitted to the inductor 38, where this electrical signal undergoes a first voltage regulation. After the first voltage regulation, the electrical signal is further transmitted to the IVR die 10 through the through-vias of the IVR die 10, where it undergoes a second voltage regulation. This double regulation results in better voltage regulation of the signal before this electrical signal is transmitted to the overlying plurality of package components 94 through the redistribution structure 48.

Advantages can be achieved as a result of forming the package 600 that includes the inductor 38 that comprises the RDL coil 37. The RDL coil 37 is embedded in the dielectric layers 76A of the redistribution structure 74 and is disposed below and overlapped by the IVR die 10. Advantageous features of one or more embodiments disclosed herein may allow the RDL coil 37 to act as an inductor to enhance voltage regulation and improve electrical performance of the package 600. In addition, the inductor 37 being disposed beneath the IVR die 10 allows for better voltage input control to the IVR die 10.

Figure 19:
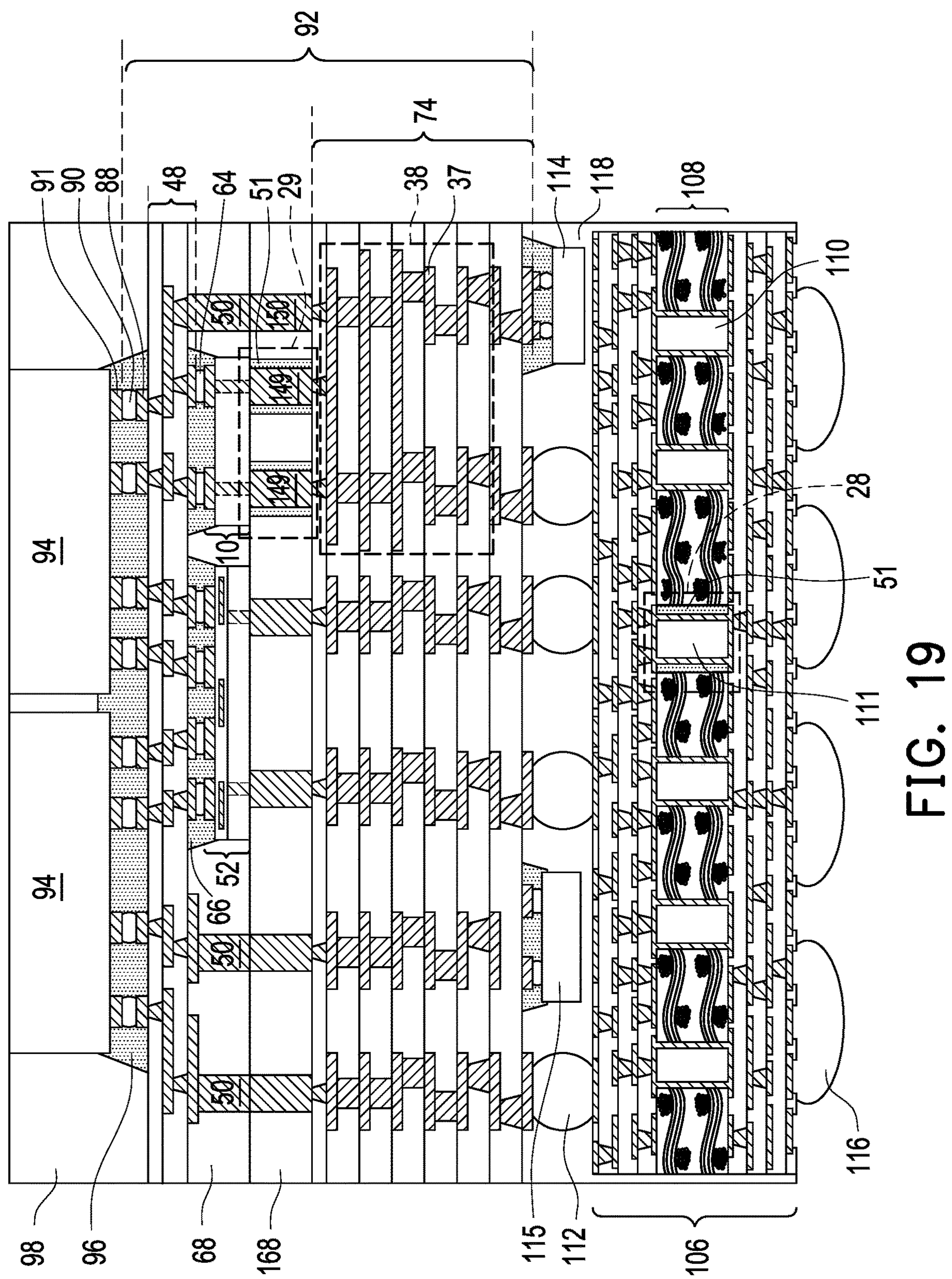
FIG. 19 illustrates a cross-sectional view of an intermediate stage in the formation of a package including an inductor die in accordance with alternate embodiments.

FIG. 19 illustrates a package 700 in accordance with an alternative embodiment. Unless specified otherwise, like reference numerals in this embodiment (and subsequently discussed embodiments) represent like components in the embodiment shown in FIGS. 1 through 18 formed by like processes. Accordingly, the process steps and applicable materials may not be repeated herein.

The package 700 illustrated in FIG. 19 may be similar to the package 200 illustrated in FIG. 14 in that there are no conductive vias 49 having sidewalls coated and encircled with the magnetic material 51 adjacent to the IVR die 10. For example, there are no inductors (such as inductor 27, see FIG. 13) that are disposed at a same level to the IVR die 10. The package 700 comprises the encapsulant 168 disposed below the encapsulant 68, the IVR die 10, and the discrete die 52. The encapsulant 168 is disposed between the encapsulant 68 and the redistribution structure 74.

The conductive vias 149 and the conductive vias 150 are formed to extend through the encapsulant 168. The conductive vias 149 and the conductive vias 150 may be in physical contact with and electrically connect the conductive vias 50, the discrete die 52, and the IVR die 10 to the redistribution structure 74. The conductive vias 149 may be formed over and in physical contact with the through-vias of the IVR die 10, and the conductive vias 150 may be formed over and in physical contact with the through-vias 56 of the discrete die 52. The conductive vias 150 are also formed over and in physical contact with the conductive vias 50. Although two of the first conductive vias 150 are shown in FIG. 19, any number of first conductive vias 150 may be formed over and electrically connected to the IVR die 10.

Magnetic material 51 is formed to surround and encircle an entirety of the sidewalls of each of the conductive vias 149. The IVR die 10 and the discrete die 52 are electrically and signally connected to the package components 94 through the redistribution structure 48. The conductive vias 149 and the encircling magnetic material 51 around each of the conductive vias 149 collectively form the inductor 29. This inductor 29 is embedded in the encapsulant 168 and is electrically connected to the IVR die 10 that is disposed above and overlaps the inductor 29.

The package 700 also comprises the coil structure 37 (also referred to as a RDL coil subsequently) that is embedded in the dielectric layers 76A of the redistribution structure 74. The RDL coil 37 is formed during the formation of the redistribution structure 74 (described previously in FIGS. 7 and 8), and is formed using similar materials and using same processes as those used in the formation of the RDLs 78A.

The RDL coil 37 embedded in the dielectric layers 76A forms the inductor 38. The inductor 38 can also be referred to as an air inductor since there is no magnetic core made of a ferromagnetic material disposed between the coils of the RDL coil 37. Rather, the RDL coil 37 is embedded in the dielectric layers of the redistribution structure 74. The inductor 38 is disposed below and overlapped by the inductor 29, and the inductor 29 and the inductor 38 are electrically connected to each other. In this way, The RDL coil 37 is electrically connected to the IVR die 10 using through-vias in the IVR die 10 and the inductor 29. An applied signal input through the conductive connectors 116 is transmitted to the inductor 38, where this electrical signal undergoes a first voltage regulation. After the first voltage regulation, the electrical signal is further transmitted to the inductor 29, where this electrical signal undergoes a second voltage regulation. After the second voltage regulation, the double regulated electrical signal is transmitted to the IVR die 10 using the through-vias of the IVR die 10, where it undergoes a third voltage regulation. This triple regulation results in better voltage regulation of the signal before this electrical signal is transmitted to the overlying plurality of package components 94 through the redistribution structure 48. In an embodiment, the inductor 38 is configured such that the coils of the RDL coil 37 have a DC resistance that is lower than 40 mΩ. To achieve this lower DC resistance, the RDL coil 37 is also physically and electrically connected to at least one conductive via 150 that extends through the encapsulant 168, wherein the at least one conductive via 150 is adjacent to the conductive vias 149 and is disposed above and overlaps the inductor 38. The at least one conductive via 150 is in physical and electrical contact with a conductive via 50 that extends through the encapsulant 68. The inductor 38 therefore is electrically connected to the redistribution structure 48 through the at least one conductive 150 and the conductive via 50. In an embodiment, the inductor 38 is configured such that an AC resistance from the dielectric layers 76A of the redistribution structure 74 is lower than 90Ω.

Advantages can be achieved as a result of forming the at least one conductive via 150 extending through the encapsulant 168 and the conductive via 50 extending through the encapsulant 68, the conductive via 50 being in physical and electrical contact with the at least one conductive via 150. The inductor 38 is electrically connected to the redistribution structure 48 through the at least one conductive via 150 and the conductive via 50, allowing for a reduced DC resistance of the coils of the RDL coil 37 that is lower than 40 mΩ.

Further referring to FIG. 19, the package 700 may optionally also comprise the PTH 111 and the encircling magnetic material 51 to collectively form the inductor 28 (described previously in FIG. 13). This inductor 28 is embedded in the dielectric core 108 and is electrically connected to the IVR die 114, wherein the inductor 28 is disposed below the IVR die 114.

Advantages can be achieved as a result of forming the package 700 that includes the conductive vias 149 having sidewalls coated and encircled with the magnetic material 51. The conductive vias 149 and the magnetic material 51 collectively form the inductor 29 that is electrically connected to the IVR die 10. The inductor 29 is embedded in the encapsulant 168, and is disposed below and is overlapped by the IVR die 10, wherein the conductive vias 149 are in physical contact with the through-vias of the IVR die 10. In addition, the package 700 also includes the inductor 38 that comprises the RDL coil 37, wherein the inductor 38 is disposed below and is overlapped by the inductor 29. The RDL coil 37 is embedded in the dielectric layers 76A of the redistribution structure 74 and is also disposed below and overlapped by the IVR die 10. The inductor 38 and the inductor 29 are electrically connected to each other. Advantageous features of one or more embodiments disclosed herein may allow the inductors 29 and 38 to enhance voltage regulation and improve electrical performance of the package 700. In addition, the inductors 29 and 38 being disposed beneath and being overlapped by the IVR die 10 allow for better voltage input control to the IVR die 10.

In accordance with an embodiment, a method of forming an inductor includes forming a first redistribution structure on a substrate; forming a first conductive via over and electrically connected to the first redistribution structure; depositing a first magnetic material over a top surface and sidewalls of the first conductive via; coupling a first die and a second die to the first redistribution structure; encapsulating the first die, the second die, and the first conductive via in an encapsulant; and planarizing the encapsulant and the first magnetic material to expose the top surface of the first conductive via while a remaining portion of the first magnetic material remains on sidewalls of the first conductive via, where the first conductive via and the remaining portion of the first magnetic material provide an inductor. In an embodiment, the first magnetic material includes cobalt zirconium tantalum (CoZrTa). In an embodiment, the method further includes forming a second redistribution structure over and electrically coupled to the first conductive via; and coupling a third die to the second redistribution structure, where the second redistribution structure is disposed between the third die and the first die. In an embodiment, the first die and the third die are integrated voltage regulator (IVR) dies. In an embodiment, the method further includes coupling a package substrate to the second redistribution structure, where the package substrate is electrically connected to the third die through the second redistribution structure. In an embodiment, the package substrate includes a dielectric core, a plating through-hole (PTH) extending through the dielectric core; and a second magnetic material extending over outer sidewalls of the PTH. In an embodiment, the first magnetic material is the same as the second magnetic material.

In accordance with an embodiment, a structure includes a first redistribution structure; a first die over the first redistribution structure; a second redistribution structure over and electrically coupled to the first die; an inductor disposed between the first redistribution structure and the second redistribution structure, where the inductor includes a first magnetic material; and a first conductive via, where the first magnetic material encircles an entirety of sidewalls of the first conductive via in a plan view; and a second die coupled to the first redistribution structure; and a package substrate coupled to the first redistribution structure, where the second die is disposed between the package substrate and the first redistribution structure. In an embodiment, the first conductive via is adjacent the first die, and where the first conductive via is in physical contact and electrically connected to the first redistribution structure and the second redistribution structure. In an embodiment, the first conductive via is disposed below and is overlapped by the first die, and where the first conductive via is in physical contact with a through-via of the first die. In an embodiment, the first magnetic material includes cobalt zirconium tantalum (CoZrTa). In an embodiment, the package substrate includes a dielectric core, a first plating through-hole (PTH) extending through the dielectric core; and a second magnetic material extending over outer sidewalls of the first PTH, where the first PTH is electrically connected to the second die through the first redistribution structure. In an embodiment, the package substrate further includes a second plating through-hole (PTH) extending through the dielectric core, where the second magnetic material covers sidewalls of the second PTH, and where the second PTH is disposed below and is overlapped by the second die.

In accordance with an embodiment, a structure includes a first redistribution structure; a first die coupled to the first redistribution structure; a package substrate coupled to the first redistribution structure, where the first die is disposed between the package substrate and the first redistribution structure, the package substrate including a core; a first routing structure on a top surface of the core; a second routing structure on a bottom surface of the core; and an inductor including a first through-via extending through the core; and a coil structure embedded in the second routing structure, where the coil structure is electrically connected to the first die through the first through-via, the first routing structure, and the first redistribution structure, where the first die is an integrated voltage regulator die, and where the first die overlaps the coil structure and the first through-via. In an embodiment, the structure further includes an underfill that is disposed on sidewalls of the package substrate. In an embodiment, the structure further includes a second through-via and a third through-via extending through the core, the second through-via and the third through-via being electrically connected to the coil structure. In an embodiment, the coil structure is overlapped by the second through-via and the third through-via. In an embodiment, a fourth through-via of the first die is in physical contact with the first routing structure. In an embodiment, the structure further includes a second die over the first redistribution structure; and a package component over and coupled to the second die, where the second die is an integrated voltage regulator die. In an embodiment, the structure further includes an underfill disposed between the first die and the package substrate, the underfill physically isolating the first die from the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a first redistribution structure;

a first die over the first redistribution structure;

a second redistribution structure over and electrically coupled to the first die;

an inductor disposed between the first redistribution structure and the second redistribution structure, wherein the inductor comprises:

a first magnetic material; and a first conductive via, wherein the first magnetic material encircles an entirety of sidewalls of the first conductive via in a plan view, and wherein the first conductive via is directly below and is overlapped by a through-via of the first die;

a second die coupled to the first redistribution structure; and a package substrate coupled to the first redistribution structure, wherein the second die is disposed between the package substrate and the first redistribution structure.

2. The structure of claim 1, wherein the first conductive via is in physical contact with the through-via of the first die.

3. The structure of claim 1, wherein the first magnetic material comprises cobalt zirconium tantalum (CoZrTa).

4. The structure of claim 1, wherein the package substrate comprises:

a dielectric core, a first plating through-hole (PTH) extending through the dielectric core; and a second magnetic material extending over outer sidewalls of the first PTH, wherein the first PTH is electrically connected to the second die through the first redistribution structure.

5. The structure of claim 4, wherein the package substrate further comprises:

a second plating through-hole (PTH) extending through the dielectric core, wherein the second magnetic material covers sidewalls of the second PTH, and wherein the second PTH is disposed below and is overlapped by the second die.

6. The structure of claim 1, wherein the first die and the second die are integrated voltage regulator dies.

7. A structure comprising:

a first redistribution structure;

a first die coupled to the first redistribution structure;

a package substrate coupled to the first redistribution structure, wherein the first die is disposed between the package substrate and the first redistribution structure, the package substrate comprising:

a core;

a first routing structure on a top surface of the core;

a second routing structure on a bottom surface of the core; and an inductor comprising;

a first through-via extending through the core; and a coil structure embedded in the second routing structure, wherein the coil structure is electrically connected to the first die through the first through-via, the first routing structure, and the first redistribution structure, wherein the first die is an integrated voltage regulator die, and wherein the first die overlaps the coil structure and the first through-via.

8. The structure of claim 7, further comprising an underfill that is disposed on sidewalls of the package substrate.

9. The structure of claim 7 further comprising a second through-via and a third through-via extending through the core, the second through-via and the third through-via being electrically connected to the coil structure.

10. The structure of claim 9, wherein the coil structure is overlapped by the second through-via and the third through-via.

11. The structure of claim 7, wherein a fourth through-via of the first die is in physical contact with the first routing structure.

12. The structure of claim 7 further comprising:

a second die over the first redistribution structure; and a package component over and coupled to the second die, wherein the second die is an integrated voltage regulator die.

13. The structure of claim 7 further comprising an underfill disposed between the first die and the package substrate, the underfill physically isolating the first die from the package substrate.

14. A structure comprising:

a first die over and electrically connected to a first redistribution structure, wherein the first die is embedded in an encapsulant;

a second die below and electrically connected to the first redistribution structure;

an inductor disposed over the first redistribution structure, wherein the inductor is embedded in the encapsulant, wherein the inductor comprises:

a first conductive via; and a first magnetic material disposed on sidewalls of the first conductive via; and a second redistribution structure over and electrically coupled to the first die, wherein the first magnetic material is in physical contact with the first redistribution structure and the second redistribution structure.

15. The structure of claim 14, further comprising:

a package component over and electrically coupled to the second redistribution structure and the first die, wherein the first die is an integrated voltage regulator die.

16. The structure of claim 14, wherein the first magnetic material comprises cobalt zirconium tantalum (CoZrTa).

17. The structure of claim 14, further comprising:

a package substrate coupled to the first redistribution structure using solder regions.

18. The structure of claim 17, further comprising:

an underfill disposed between the package substrate and the first redistribution structure, wherein the underfill surrounds the solder regions.

19. The structure of claim 18, wherein the second die is disposed between the package substrate and the first redistribution structure.

20. The structure of claim 19, wherein the second die is an integrated voltage regulator die.

* * * * *